(12) United States Patent
Miyake

(10) Patent No.: US 7,110,033 B2
(45) Date of Patent: Sep. 19, 2006

(54) IMAGING DEVICE HAVING AN IMAGING ELEMENT MOUNTED ON A SUBSTRATE

(75) Inventor: Hiroyuki Miyake, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 820 days.

(21) Appl. No.: 09/827,096

(22) Filed: Apr. 6, 2001

(65) Prior Publication Data

US 2001/0050721 A1 Dec. 13, 2001

(30) Foreign Application Priority Data

Apr. 7, 2000 (JP) .............................. 2000-106236

(51) Int. Cl.
*H04N 5/225* (2006.01)
(52) U.S. Cl. ...................... 348/340; 348/374
(58) Field of Classification Search ........... 348/207.99, 348/335, 340, 360, 374, 375, 65, 45; 257/433, 257/239
See application file for complete search history.

(56) References Cited

U.S. PATENT DOCUMENTS

| | | | | |
|---|---|---|---|---|
| 4,870,496 A | * | 9/1989 | Fantone | ...................... 348/342 |
| 5,040,069 A | * | 8/1991 | Matsumoto et al. | ........... 348/76 |
| 5,220,198 A | | 6/1993 | Tsuji | |
| 5,861,654 A | * | 1/1999 | Johnson | ...................... 257/433 |
| 6,122,009 A | * | 9/2000 | Ueda | .......................... 348/335 |

FOREIGN PATENT DOCUMENTS

| | | |
|---|---|---|
| EP | 0 475 370 | 3/1992 |
| EP | 0 807 976 | 11/1997 |
| EP | 0 840 369 | 5/1998 |
| EP | 0 917 189 | 5/1999 |
| FR | 2 800 911 | 5/2001 |
| JP | 6-85222 | 3/1994 |
| JP | 7-99214 | 4/1995 |
| JP | 9-199701 | 7/1997 |
| JP | 10-32323 | 2/1998 |
| JP | 11-191864 | 7/1999 |
| JP | 2000-125212 | 4/2000 |
| JP | 2001-085654 | 3/2001 |
| WO | WO 92/15036 | 9/1992 |

\* cited by examiner

*Primary Examiner*—Thai Tran
*Assistant Examiner*—Heather R. Jones
(74) *Attorney, Agent, or Firm*—Oblon, Spivak, McClelland, Maier & Neustadt, P.C.

(57) ABSTRACT

There is described a low-cost imaging device fixed focus type which is to be provided in a portable terminal equipment and enables easy assembly. An opening section is formed in a substrate. An imaging element is secured on the substrate such that a plane including a light-receiving surface for receiving an optical signal closes the opening section. An optical element having an imaging lens section for providing optical information is attached to the light-receiving surface. The optical element is arranged so as to come into contact with the upper surface of the imaging element by way of the opening section of the substrate.

16 Claims, 33 Drawing Sheets

Fig. 18A
Fig. 18B
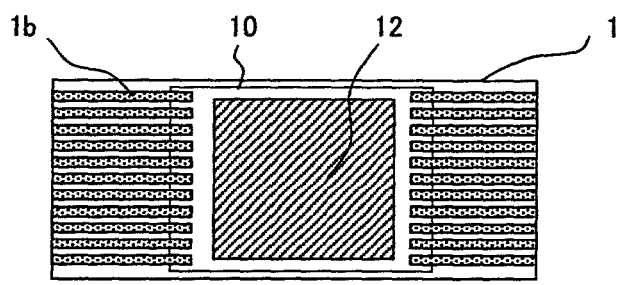
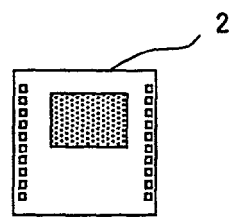
Fig. 19
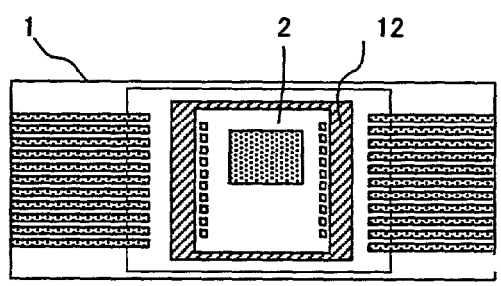
Fig. 20
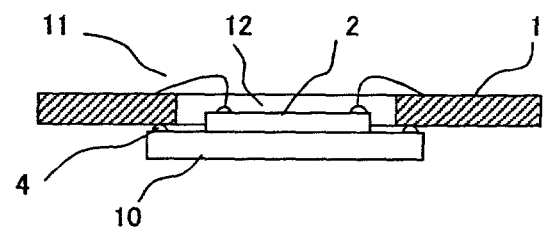

(A)

Fig. 30A    Fig. 30B    Fig. 30C
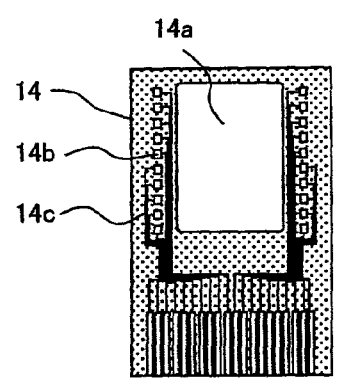 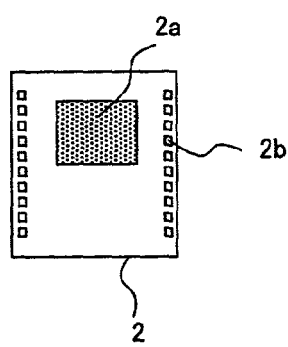 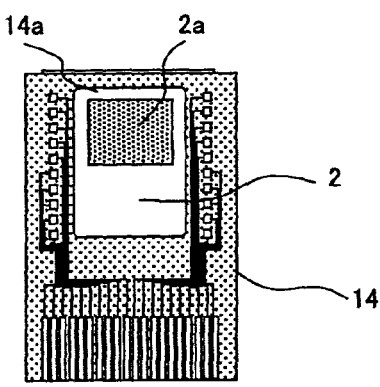
Fig. 31
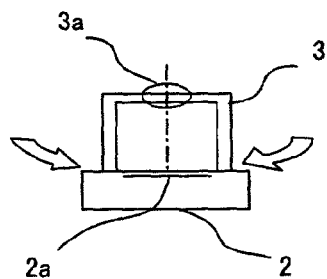

Fig. 64
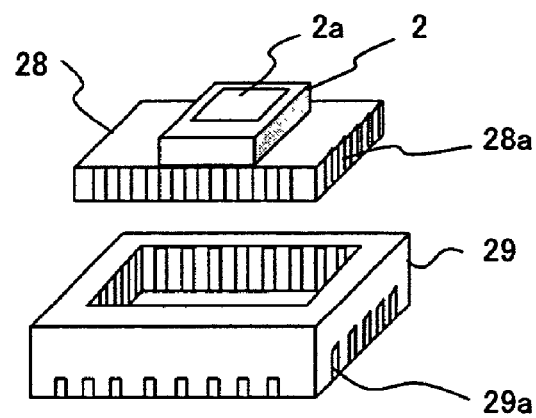
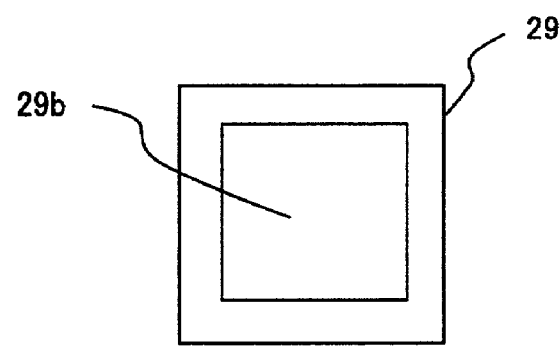
Fig. 65A
Fig. 65B
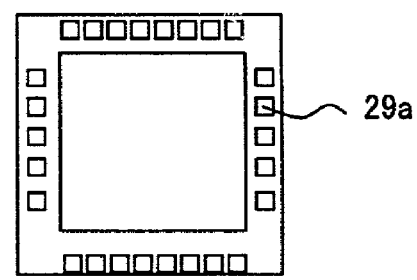
Fig. 65C

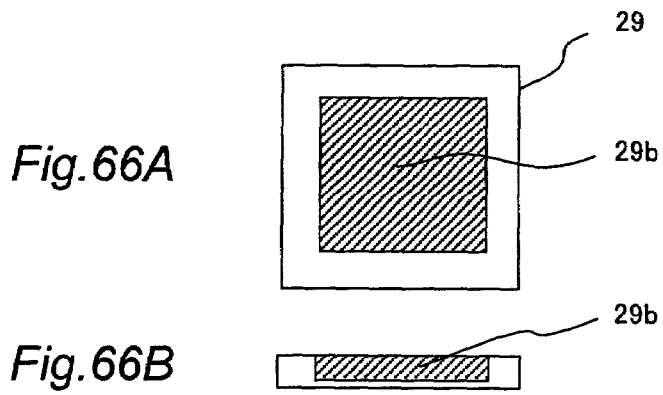
Fig.66A
Fig.66B
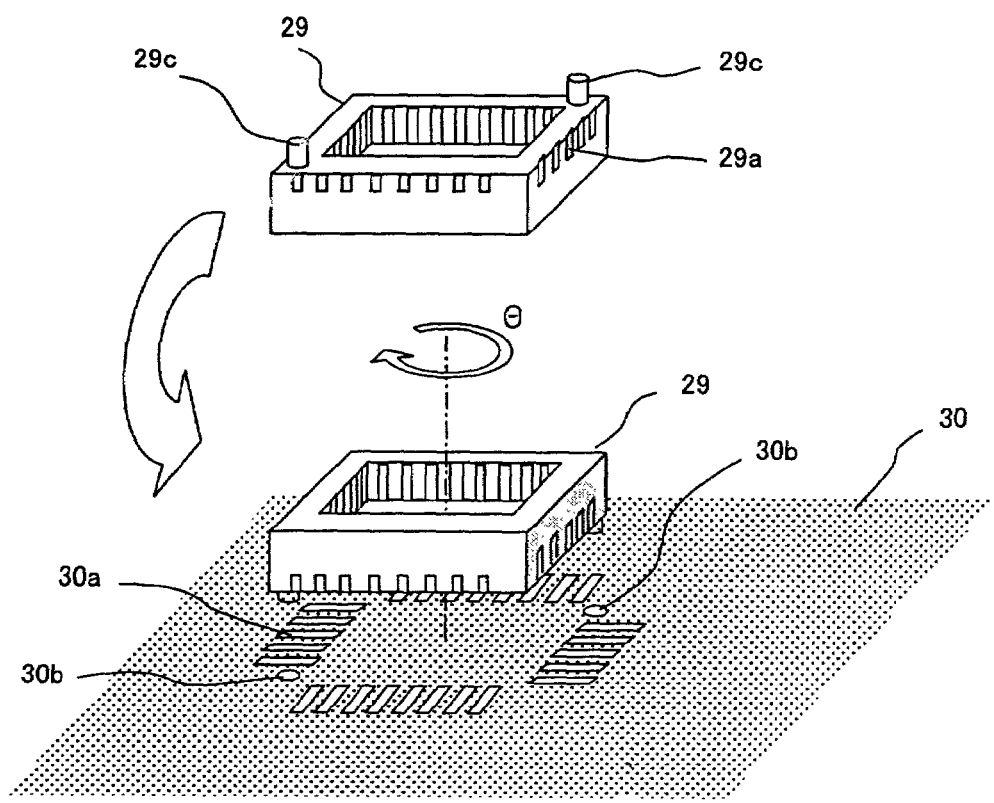
Fig.67

IMAGING DEVICE HAVING AN IMAGING ELEMENT MOUNTED ON A SUBSTRATE

BACKGROUND OF THE INVENTION

1. Field of the Invention

The present invention relates to an imaging device, and more particularly, to a compact imaging device suitable for being mounted on a portable terminal equipment having image pickup capability.

2. Description of the Background Art

FIG. 70 is a cross-sectional view showing the structure of a related-art imaging device described in Japanese Patent Application Laid-Open No. Hei6-85222. In the drawing, reference numeral 2 designates an imaging element; 22 designates a lead frame; and 10 designates a peripheral element. The imaging element 2 is three-dimensionally provided on top of an island 31, and the peripheral element 10 is three-dimensionally provided on the lower surface of the island 31.

As shown in FIG. 70, reference numeral 11 designates wires for wire bonding purpose which electrically connect the imaging element 2 and the peripheral element 10 to the lead frame 22; and 23 designates a premolded material. The premolded material 23 has an opening which goes through the imaging element 2 so as to ensure an optical path. Reference numeral 32 designates a light-shielding liquid crystal plate which is to be fastened on the premolded material 23 by means of an adhesive in the manner as illustrated.

The related-art imaging device has an unillustrated separate lens. By way of the separate lens and the light-shielding liquid-crystal plate 32, optical information is focused in the form of an image on the solid-state imaging element 2. The thus-imaged optical information is converted into an electrical signal by means of the solid-state imaging element 2, and the resultant signal is output. The peripheral element 10 delivers appropriate performance in accordance with the type of an imaging device. Here, the function of the peripheral element 10 is not the feature of the related-art imaging device, and hence explanations of operation of the peripheral element 10 are omitted.

As mentioned above, the related-art imaging device shown in FIG. 70 involves the peripheral element 10 and the imaging element 2 in a single package. For this reason, there is required a smaller area for mounting the imaging device than that required when the peripheral element 10 and the imaging element 2 are packaged separately. Hence, the related-art imaging device promotes miniaturization of a portable terminal equipment, such as a video camera.

FIG. 71 is a cross-sectional view showing a related-art imaging device described in Japanese Patent Application Laid-Open No. Hei10-32323. As shown in FIG. 71, reference numeral 33 designates a lead electrode; 2 designates an imaging element; 3 designates an optical element whose lens mount section is integrally formed with an imaging lens 3a; and 10 designates a peripheral element bonded to the underside of the imaging element 2 by means of an adhesive. A metallized electrode film 34 is formed on the underside of a lens mount section of the optical element 3. The electrode of the imaging element 2 is electrically connected to and integrated with the lead electrode 33 by way of the metallized electrode film 34. The peripheral element 10 is electrically connected to the lead electrode 33 by means of a wire 11 for wire bonding purpose.

In the related-art imaging device shown in FIG. 71, the peripheral element 10 is bonded directly to the underside of the imaging element 2 by way of an adhesive. The imaging device shown in FIG. 71 obviates the island section required by the related-art imaging device shown in FIG. 70 (i.e., the device described in Japanese Patent Application Laid-Open No. Hei6-85222). Therefore, the construction shown in FIG. 71 renders the imaging device more compact than in the case where the construction shown in FIG. 70 is employed.

FIG. 72 is a perspective view of a related-art imaging device described in Japanese Patent Application Laid-Open No. Hei9-283569. In the drawing, reference numeral 2 designates an imaging element; and 2a designates a figure of a light-receiving surface of the imaging element 2 which can be shown on the reverse side of the imaging element 2. Reference numeral 8 designates an anisotropic conductive film. The center of the film 8 is cut out to form an opening for the light-receiving surface 2a of the imaging element 2. Reference numeral 35 designates a translucent circuit board. Terminal sections 35a are arranged on the surface of the circuit board 35. The imaging element 2 is electrically connected to the terminal sections 35a by means of flip chip bonding by way of the anisotropic conductive film 8 and is integrated with the circuit board 35 in a face down manner.

A lens section is omitted in the imaging device shown in FIG. 72. In this imaging device, optical information is focused on the imaging element 2 by way of the translucent circuit board 35 and the center section (i.e., an opening formed by means of cutout) of the anisotropic conductive film 8. The related-art imaging device shown in FIG. 72 is made compact, by means of connecting the imaging element 2 to the circuit board 35 by use of the flip chip bonding technique.

In the descriptions of the related-art technique, the devices described in the Laid-Open Patent Applications are simplified. Further, in order to match the descriptions of the related-art devices with the descriptions of preferred embodiments of the present invention, the reference numerals and names assigned to individual sections of the related-art devices are employed also in the description of the preferred embodiments of the present invention.

In the related-art imaging device shown in FIG. 70 or 72, the imaging lens section is separate from the unit containing the imaging element 2. In order to implement the function of the imaging device, lens components must be assembled separately. In this case, in order to enable correct imaging of optical information, a lens is provided with a mechanism for adjusting a focal point, and a focal length must be controlled at the time of assembly of the lens. Such a focus control mechanism affects the outer dimensions of an imaging device, thereby hindering miniaturization of the imaging device.

In the imaging device shown in FIG. 71, an imaging lens is constituted by means of assembling an imaging lens section and a lens mount section into a single molded component, thereby obviating a necessity of assembling lens components separately. However, the imaging device requires an advanced technique, such as a technique for forming a metallized electrode on the underside of the lens mount section, thereby involving high machining costs and imposing difficulty in reducing the price of the lens mount section. Further, lens components are assembled around the periphery of the imaging element 2, with the result that the imaging element 2 is susceptible to chipping.

SUMMARY OF THE INVENTION

The present invention has been conceived to solve the drawbacks set forth and is aimed at providing a low-cost imaging device which enables easy assembly of an optical element of fixed focus type including an imaging lens while stable process quality is ensured.

The present invention is also aimed at providing a compact imaging device which has the function of improving the imaging performance of imaging equipment, as well as the above-stated characteristics.

The above objects of the present invention are achieved by an imaging device including integrally an imaging element to be mounted on a substrate and an optical element having an imaging lens section for providing a light-receiving surface of the imaging element with optical information. The substrate has an opening section. The imaging element is fastened on the substrate so as to close the opening section with a surface including the light-receiving surface. The optical element is arranged so as to come into contact with the upper surface of the imaging element by way of the opening section.

The above objects of the present invention are achieved by an imaging device including an imaging element which receives optical information and generates imaging data and an image processing peripheral element for processing the imaging data. The device includes a substrate having an opening section formed therein. The peripheral element is secured on the substrate so as to close the opening section. The imaging element is provided in a cavity defined by the opening section and the peripheral element.

The above objects of the present invention are achieved by an imaging device having an imaging element to be mounted to a substrate. The substrate has a first section having an outer dimension equal to or smaller than that of the imaging element as well as an opening section formed therein and a second section having an interface connection section formed therein. The imaging element is secured on the first section such that a surface including a light-receiving surface closes the opening section. A circuit pattern is formed in the first section for electrically connecting the imaging element to the interface connection section provided on the second section.

Other objects and further features of the present invention will be apparent from the following detailed description when read in conjunction with the accompanying drawings.

BRIEF DESCRIPTION OF THE DRAWINGS

FIG. 18A is a plan view showing the substrate and the peripheral element shown in FIG. 16 when viewed from the back of the structure shown in FIG. 16;

FIG. 18B is a plan view showing an imaging element employed in the imaging device according to the sixth embodiment of the present invention;

FIG. 19 shows the substrate having the imaging element mounted thereon when viewed from the imaging element;

FIG. 20 is across-sectional view of another imaging device according to the sixth embodiment of the present invention;

FIG. 30A is a plan view of a film-like substrate employed in the tenth embodiment of the present invention;

FIG. 30B is a plan view of an imaging device employed in the tenth embodiment of the present invention;

FIG. 30C is a plan view of the film-like substrate having the imaging device mounted thereon;

FIG. 31 is a schematic view showing a characteristic of the imaging device of the present invention;

FIG. 64 is a perspective view of an imaging device according to a twentieth embodiment of the present invention;

FIGS. 65A through 65C are views showing a socket component employed in the imaging device according to the twentieth embodiment of the present invention;

FIGS. 66A and 66B are views showing another socket component employed in the imaging device according to the twentieth embodiment of the present invention;

FIG. 67 is a perspective view of an imaging device according to a twenty-first embodiment of the present invention;

DESCRIPTION OF THE PREFERRED EMBODIMENTS

First Embodiment

Figure 1:
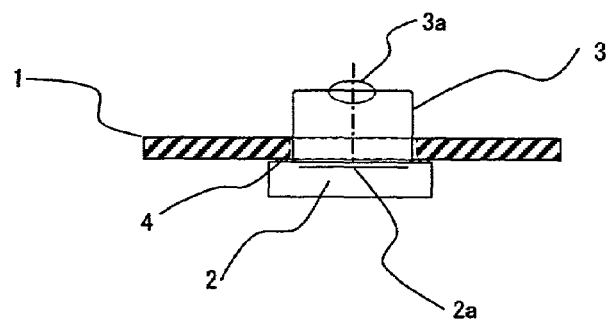
FIG. 1 is a cross-sectional view of an imaging device according to a first embodiment of the present invention.

An imaging device according to a first embodiment of the present invention will be described hereinbelow by reference to FIGS. 1 through 4. Throughout the drawings, constituent elements commonly shown in the drawings are assigned the same reference numerals, and repeated explanations thereof are omitted.

In FIG. 1, reference numeral 1 designates a substrate having an opening section 1a formed therein; 2 designates an imaging element having a light-receiving surface 2a; 3 designates an optical element including an imaging lens section 3a; and 4 designates electrode bumps provided on terminals of the imaging element 2. The imaging element 2 is mounted face down on the substrate 1 so as to close the opening section 1a and is electrically connected to the substrate 1 by means of the bumps 4. The optical element 3 is assembled so as to come into contact with the upper surface of the imaging element 2 within the space defined by the opening section 1a of the substrate 1.

The structure of the imaging device according to the present embodiment will be described in detail by reference to FIGS. 2, 3, and 4.

Figure 2A:
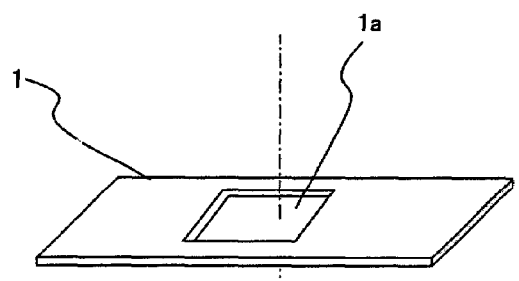
FIG. 2A is a perspective view showing a structure of the imaging device according to a first embodiment of the present invention.

FIG. 2A is a perspective view showing the positional relationship before the imaging element 2 is mounted on the substrate 1.

Figure 2B:
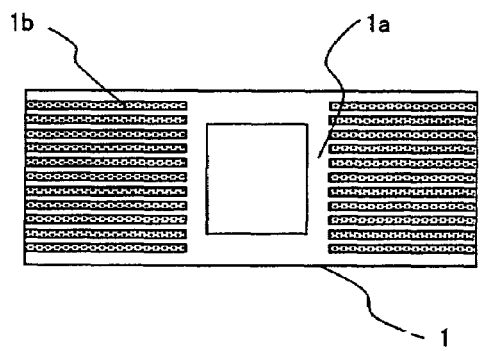
FIG. 2B is a plan view of a substrate employed in the imaging device according to a first embodiment of the present invention.

FIG. 2B is a plan view of the substrate 1 when seen from the imaging element 2 (hereinafter the surface of the substrate 1 shown in this drawing will be taken as an "underside"). As illustrated, a circuit pattern 1b is formed on the substrate 1.

Figure 2C:
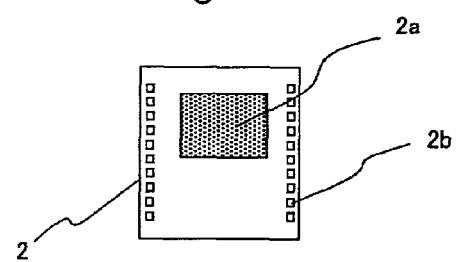
FIG. 2C is a plan view of an imaging element employed in the imaging device according to a first embodiment of the present invention.

FIG. 2C is a plan view of the imaging element 2 when viewed from the top in FIG. 2A. As illustrated, the imaging element 2 is formed from a light-receiving surface 2a and an input/output terminal 2b.

In the present embodiment, circuit patterns 1b laid on the substrate and I/O terminals 2b provided on the imaging element 2 are arranged in a one-to-one relationship. An opening section 1a of the substrate 1 is smaller than the outer dimensions of the imaging element 2 and larger than the light-receiving surface 2a.

Figure 3A:
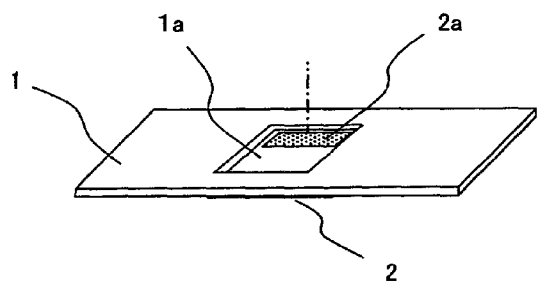
FIG. 3A is a perspective view of the substrate employed in the imaging device according to a first embodiment of the present invention.
Figure 3B:
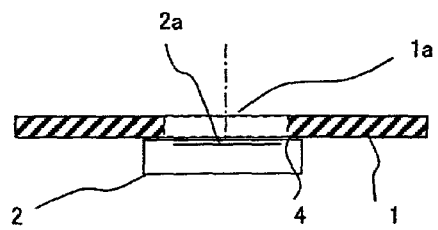
FIG. 3b is a cross-sectional view of the substrate employed in the imaging device according to a first embodiment of the present invention.

FIG. 3A is a perspective view showing the imaging element 2 mounted face down on the substrate 1 so as to close the opening section 1a. FIG. 3B is a cross-sectional view showing the positional relationship between the imaging element 2 and the substrate 1, which are shown in FIG. 3A.

As shown in FIG. 3B, the imaging element 2 is configured such that an overlap exists between the imaging element 2 and the periphery of the opening section 1a of the substrate 1. The size of the opening section 1a of the substrate 1 and the size of the light-receiving surface 2a of the imaging element 2 are determined in the manner which has been described by reference to FIGS. 2A through 2C. Accordingly, no overlap exists between the light-receiving surface 2a and the opening section 1a, and the light-receiving surface 2a can receive optical information without being affected by the substrate 1.

In the region of the overlap between the substrate 1 and the imaging element 2, the circuit patterns 1b are electrically connected to the I/O terminals 2b provided on the imaging element 2, through flip chip bonding (FCB) using an anisotropic conductive film (ACF) or a like film.

Since the FCB technique is irrelevant to the point of novelty of the present invention, detailed description of the technique is omitted from the specification. The present embodiment is not limited to the FCB technique using an ACF. For instance, electrical connection may be established while an anisotropic conductive paste (ACP) is used in lieu of an ACF. Alternatively, electrical connection may be established without use of an ACF or ACP, by means of bringing the bumps 4 provided on the I/O terminals 2b of the imaging element 2 into contact with the circuit patterns 1b laid on the substrate 1, or by means of ultrasonic welding. Moreover, if there is room in pattern pitch around a portion in which electrical connection is to be established, only the portion to be electrically connected may be connected with the corresponding terminals, through use of a conductive adhesive.

Figure 4A:
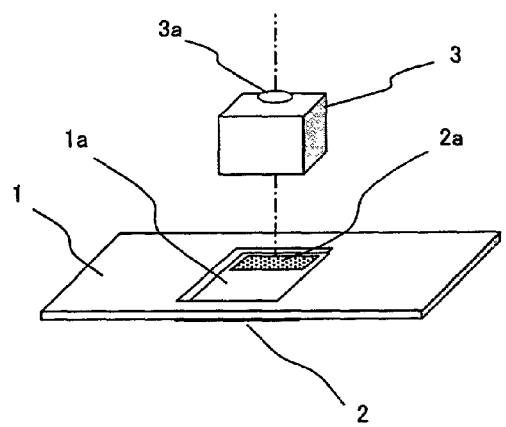
FIGS. 4A and 4B are perspective views the substrate and a optical element employed in the imaging device according to a first embodiment of the present invention.
Figure 4B:
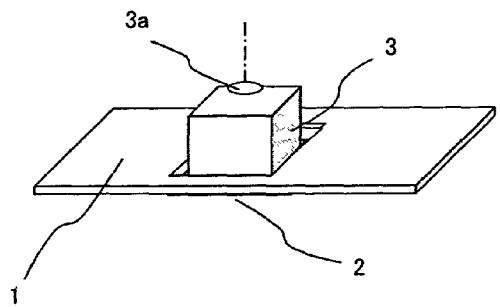

FIG. 4A is a perspective view showing the positional relationship between the substrate 1, the imaging element 2, and the optical element 3. FIG. 4B is a perspective view showing the structure shown in FIGS. 3A and 3B when the optical element 3 is mounted on the structure. It is be noted that FIG. 1 shows the structure shown in FIG. 4B in cross section. Here, the optical element 3 is assembled in such a way as to come into contact with the upper surface of the imaging element 2; more specifically, the area of the imaging element 2 other than the light-receiving section 2a, by way of the opening section 1a formed in the substrate 1.

Figure 70:
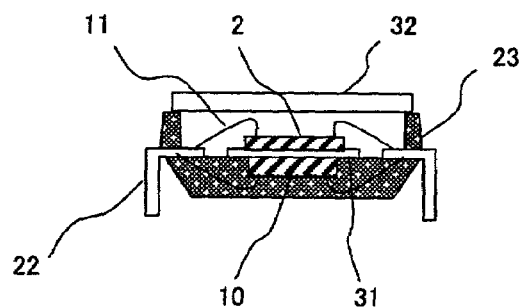
FIG. 70 is a cross-sectional view of a first related-art imaging device.

The related-art imaging device shown in FIG. 70 substantially comprises a substrate having an imaging element and an optical element provided thereon. The minimum thickness of the imaging device is determined by the thickness of the imaging element 2, a focal length, and the thickness of the substrate 1. In contrast, the imaging device according to the present embodiment has the substrate 1 interposed between the imaging lens section 3a of the optical element 3 and the imaging element 2. Accordingly, the minimum thickness of the imaging device can be reduced.

In the imaging device according to the present embodiment, the optical element 3 is assembled such that upper surface of the imaging element 2 serves as a reference surface by way of the opening section 1a of the substrate 1. The heightwise accuracy of the imaging lens section 3a fixed on the optical element 3 and that of the light-receiving surface 2a formed on the imaging element 2; that is, the accuracy of focus, can be made stable without use of a special focus control mechanism and without involvement of special focus control operation. Even in this respect, the imaging device according to the present embodiment is more suitable for miniaturization than is the related-art imaging device and has the advantage of making manufacturing processes simpler than those for the related-art imaging device.

Figure 71:
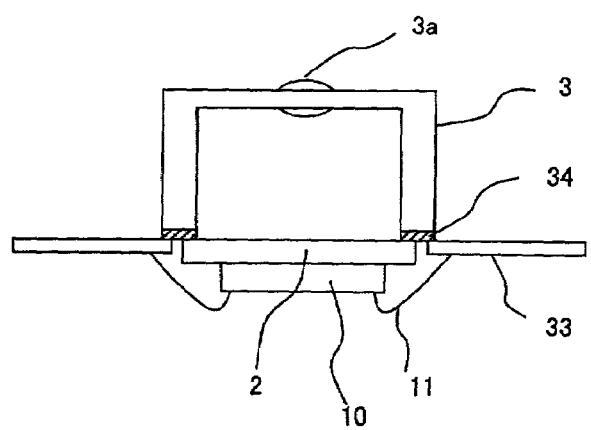
FIG. 71 is a cross-sectional view of a second related-art imaging device.
Figure 72:
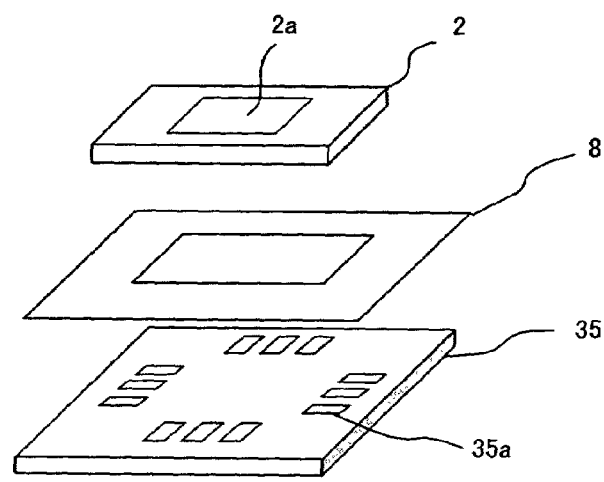
FIG. 72 is a perspective view showing a third related-art imaging device.

The related-art imaging device shown in FIG. 71 requires a complicated structure including the metallized electrode film 34 for ensuring connection between the imaging element 2 and the lead electrode 34. In contrast, the imaging device according to the present embodiment enables establishment of desired connection on the imaging element 2 by means of only stacking the imaging element 2 on the substrate 1. The imaging device according to the present embodiment has the advantage of being implemented at lower cost than in the case of the related-art imaging device.

Although in the first embodiment set forth the example circuit configuration of the substrate 1 has been described by reference to FIG. 2B, the circuit configuration is not limited to that shown in FIG. 2B. For instance, even in a case where a multilayer circuit board is used, there can be yielded the same advantageous effect as that yielded in the first embodiment.

Second Embodiment

An imaging device according to a second embodiment of the present invention will be described by reference to FIGS. 5 through 8. Constituent elements commonly shown in the drawings are assigned the same reference numerals, and repeated explanations thereof are omitted.

Figure 5:
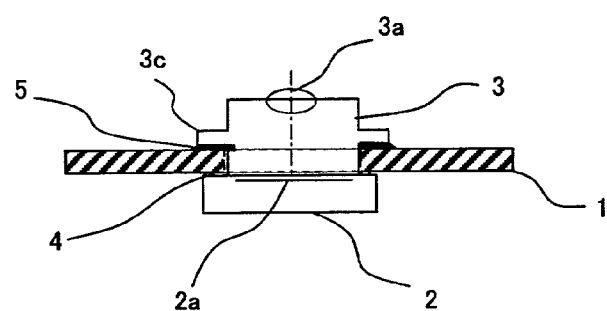
FIG. 5 is a cross-sectional view of an imaging device according to a second embodiment of the present invention.

As shown in FIG. 5, reference numeral 1 designates a substrate having an opening formed therein; 2 designates an imaging element having a light-receiving surface 2a; 3 designates an optical element including an imaging lens section 3a; and 3c designates a protuberance provided on the optical element 3 to be used for mounting the optical element 3. The optical element 3 and the substrate 1 are bonded into a single piece by means of an adhesive 5 applied on the protuberance 3c.

Figure 6A:
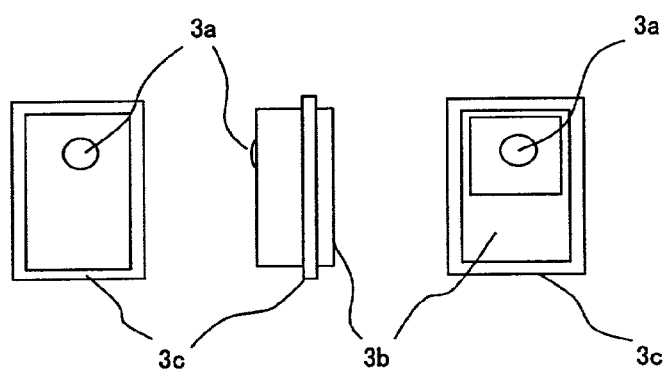
FIG. 6A shows a plan view of an optical element employed in the second embodiment (provided on the left side), a side view of the optical element (provided in the middle), and a bottom view of the optical element (provided on the right side)
Figure 6B:
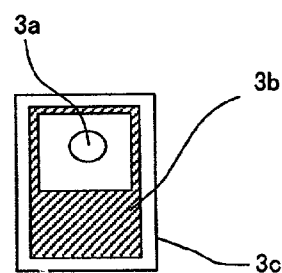
FIG. 6B is similar to the bottom view of the optical element, except that the area of the optical element to be brought into contact with an imaging element is hatched.

FIG. 6A shows a plan view of the optical element 3 employed in the present embodiment (provided on the left side), a side view of the optical element 3 (provided in the middle), and a bottom view of the optical element 3 (provided on the right side). FIG. 6B is similar to the bottom view of the optical element 3, except that the area of the optical element 3 to be brought into contact with the imaging element 2 is hatched. In these drawings, reference numeral 3a designates an imaging lens section; 3b designates a reference surface to be brought into contact with the imaging element 2; and 3c designates a protuberance provided around the imaging element 3 for mounting purpose.

In the present embodiment, when the optical element 3 is assembled in the form shown in FIG. 5, the reference surface 3b comes into contact with the imaging element 2, and the protuberance 3c fails to come in contact with the substrate 1. In other words, when the optical element 3 is assembled in the state shown in FIG. 5, there is prevented occurrence of a clearance between the reference surface 3b and the upper surface of the imaging element 2, which would otherwise be caused when the protuberance 3c comes into contact with the substrate 1. Moreover, in the present embodiment, the optical element 3 is configured such that the reference surface 3b hatched in FIG. 6B; that is, the reference surface 3b which contacts with the light-receiving element 2, does not affect the optical information which arrives at the light-receiving surface 2a of the imaging element 2 by way of the imaging lens 3a.

In the imaging device according to the present embodiment, the device can be made thinner than the related art. Moreover, the imaging device can be assembled while the upper surface of the imaging element 2 is taken as a reference so that the heightwise accuracy of the optical element 3 is ensured. Therefore the heightwise accuracy of the imaging lens section 3a fixed on the optical element 3 and that of the light-receiving surface 2a formed on the imaging element 2; that is, the accuracy of focus, can be made stable. Further, in the present embodiment, the optical element 3 and the substrate 1 can be bonded into a single piece, thereby facilitating assembly of a compact imaging device using a fixed focal point.

In the present embodiment, the optical element 3 is integrally bonded with the substrate 1 while the upper surface of the imaging element 2 is taken as a reference. As a result, there can be eliminated variations in the accuracy of assembly in the direction of focus ascribable to variations in the thickness of an adhesive. An improvement in process quality and a reduction in failure costs involved in a production line can be achieved.

In the second embodiment set forth, an example of the reference surface 3b and that of the protuberance 3c, which belong to the optical element 3, have been described by reference to FIGS. 6A and 6B. The shape of the reference surface 3b and that of the protuberance 3c are not limited to those shown in FIGS. 6A and 6B. For instance, they may assume geometries which will be described below.

The protuberance 3c may assume any geometry, so long as the protuberance 3c can be integrally bonded to the substrate 1 without affecting the heightwise positional relationship between the reference surface 3b and the imaging element 2 while remaining in contact with the upper surface of the imaging element 2, thus assuring heightwise reference. Further, the reference surface 3b may assume any geometry, so long as the reference surface 3b does not affect the optical information arriving at the light-receiving surface 2a of the imaging element 2 and so long as the heightwise accuracy of assembly of the imaging device can be ensured with reference to the upper surface of the imaging element 2.

Figure 7A:
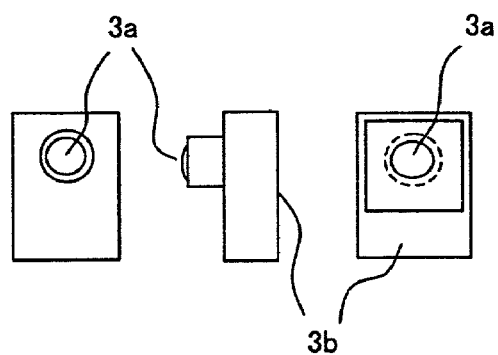
FIGS. 7A and 7B are views showing another optical element employed in the second embodiment.
Figure 7B:
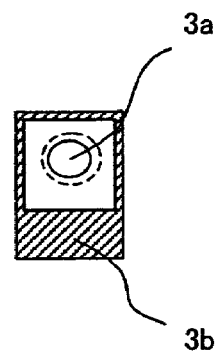
Figure 8:
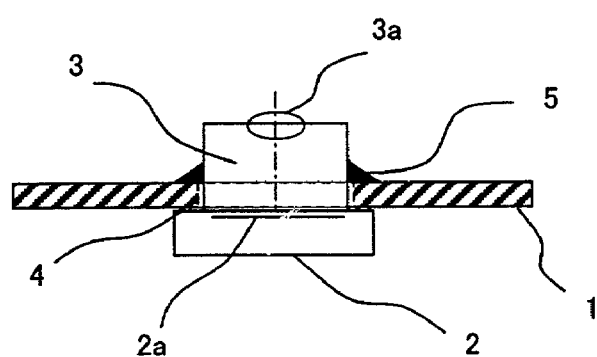
FIG. 8 is a cross-sectional view of another imaging device according to the second embodiment of the present invention.

In the second embodiment, the protuberance 3c has been described as being continuously provided around the optical element 3 of the protuberance 3c. However, the protuberance 3c may be provided around the optical element 3 in a non-continuous manner. Furthermore, a similar advantage can be yielded by using an optical element which has no protuberance 3c as shown in FIGS. 7A and 7B, when the side surface of the optical element 3 is bonded to the substrate 1 as shown in FIG. 8.

Third Embodiment

Figure 9:
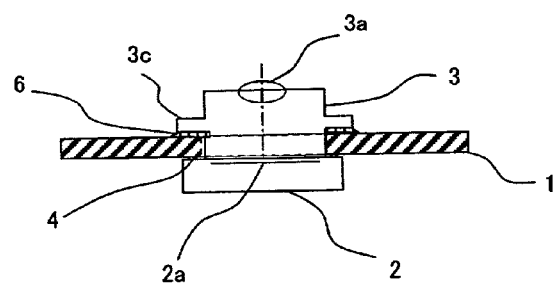
FIG. 9 is a cross-sectional view of an imaging device according to a third embodiment of the present invention.

An optical element integral-type imaging element according to a third embodiment of the present invention will be described by reference to FIG. 9. In FIG. 9, those elements which are identical with elements shown in FIG. 5 are assigned the same reference numerals, and repeated explanations thereof are omitted.

The difference between the imaging device according to the present embodiment and that shown in FIG. 5 lies in that the accuracy of assembly is improved by means of a thermoplastic adhesive 6 being used as an adhesive for bonding the optical element 3 to the substrate 1. The thermoplastic adhesive 6 is heated for softening and melting, and then cooled so as to harden. At this time, cooling induces volumetric shrinkage in the adhesive 6. In the present embodiment, the volumetric shrinkage induces a tension which draws the optical element 3 toward the imaging element 2. The tension acts as a force for increasing the adhesion between the optical element 3 and the imaging element 2. Accordingly, the imaging device according to the present embodiment improves an accuracy in the heightwise distance between the imaging lens section 3a mounted on the optical element 3 and the light-receiving surface 2a of the imaging element 2; that is, so-called a focus accuracy much greater than the imaging device shown in FIG. 5 dose.

Although the third embodiment has been described by taking the thermoplastic adhesive as an example, the advantageous effect of the present invention is not limited to the case where the thermoplastic adhesive is used. More specifically, any type of adhesive can be applied to the present invention, so long as the adhesive has the property of undergoing a volumetric change during hardening and volumetric shrinkage after hardening. For instance, a UV-setting adhesive or a room-temperature-setting adhesive may be employed.

Fourth Embodiment

An optical element integral-type imaging element according to a fourth embodiment of the present invention will now be described by reference to FIGS. 10A through 11B.

Figure 10A:
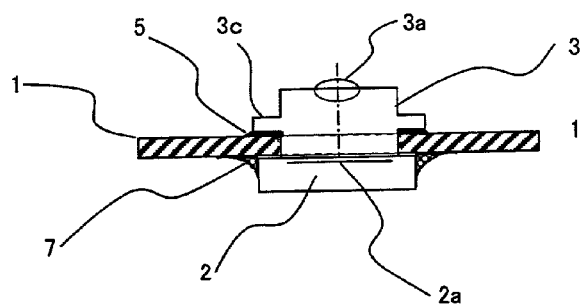
FIGS. 10A and 10B are cross-sectional views of an imaging device according to a fourth embodiment of the present invention.
Figure 10B:
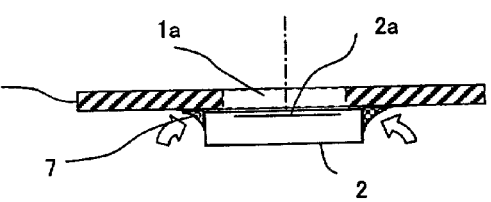

In FIGS. 10A and 10B, reference numeral 1 designates a substrate having an opening section formed therein; 2 designates an imaging element having the light-receiving surface 2a; 3 designates an optical element including an imaging lens section 3a; and 3c designates a protuberance provided on the optical element 3 for mounting an optical element. The optical element 3 and the substrate 1 are bonded into a single piece by means of the adhesive 5. Reference numeral 7 designates sealing resin provided along the entire periphery of a corner section constituted of the substrate 1 and the imaging element 2.

Figure 11A:
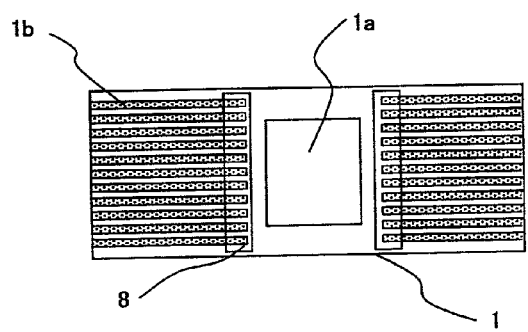
FIG. 11A is a plan view of a substrate employed in the imaging device according to the fourth embodiment of the present invention.
Figure 11B:
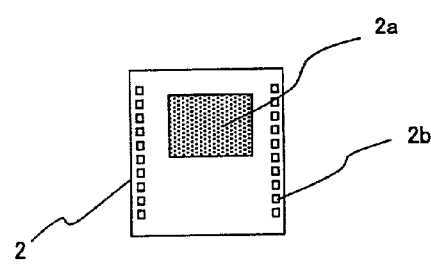
FIG. 11B is a plan view of an imaging element employed in the imaging device according to the fourth embodiment of the present invention.

FIGS. 11A and 11b correspond to FIGS. 2B and 2C described in connection with the first embodiment. In the drawings, reference numeral 8 designates an ACF used for FCB.

In a case where I/O terminals 2b of the imaging element 2 are provided on only two sides of the imaging element 2 having a rectangular shape, there is no necessity for providing an expensive ACF 8 around the entire periphery of the imaging element 2, as shown in FIG. 11A. However, in a case where the ACF 8 is provided in only the regions corresponding to the two sides of the imaging element 2, when the imaging element 2 is mounted face down on the substrate 1, a clearance is formed between the upper surface of the imaging element 2 and the substrate 1 along the two sides of the imaging element 2 which are not provided with an ACF.

In the imaging device according to the present embodiment, the clearance can be closed through use of the sealing resin 7, thereby preventing entry of extraneous substances into the device via the clearance. Provision of the sealing resin 7 enables an increase in the reliability of bonding between the imaging element 2 and the substrate 1 and prevents entry of moisture into electrical connection by way of a route designated by an arrow shown in FIG. 10B. The structure of the imaging device according to the present embodiment enables an improvement in reliability of an imaging device.

If light-shielding resin is used as the resin 7, entry of light into the device from the clearance formed between the imaging element 2 and the substrate 1 can be prevented. Accordingly, the structure according to the present embodiment yields an advantage of the ability to improve the performance of the imaging device.

Fifth Embodiment

Figure 12:
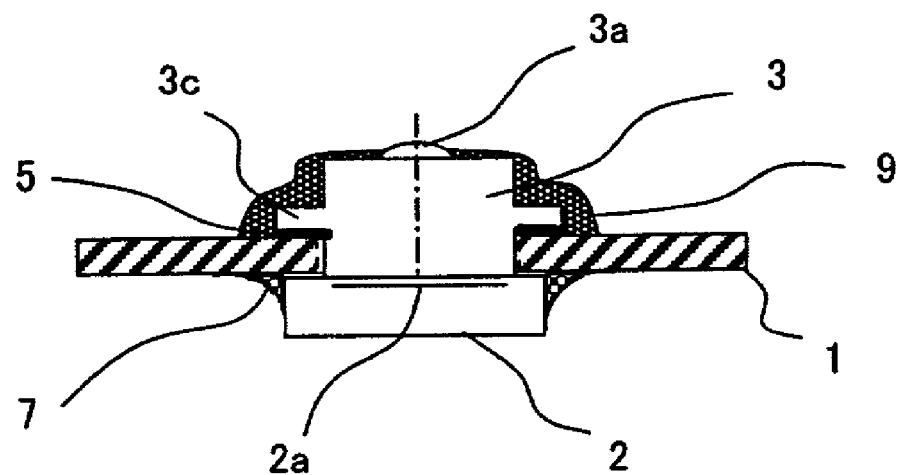
FIG. 12 is a cross-sectional view of an imaging device according to a fifth embodiment of the present invention.

An imaging device according to a fifth embodiment of the present invention will now be described by reference to FIGS. 12 and 13. In FIG. 12, those elements identical with elements shown in FIG. 10 are assigned the same reference numerals, and repeated explanations thereof are omitted.

The imaging device according to the present embodiment is based on that shown in FIG. 10 and is embodied by means of sealing the entirety of the optical element 3 exclusive of the imaging lens section 3a with resin 9 for an optical element sealing purpose. The structure of the device according to the present embodiment enables an improvement in the reliability of a bonded section between the optical element 3 and the substrate 1; that is, the reliability of a section bonded by means of the adhesive 5. If light-shielding resin is employed as the sealing resin 9, a necessity for a light-shielding cover for preventing entry of light into the imaging device can be obviated. In this way, the structure of the device according to the present embodiment enables an improvement in reliability of the imaging device and saving of components.

Figure 13:
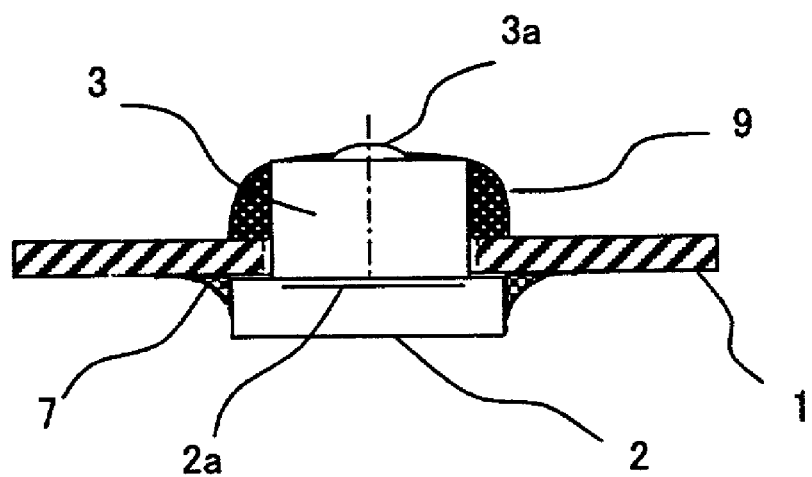
FIG. 13 is a cross-sectional view of another imaging device according to the fifth embodiment of the present invention.

As shown in FIG. 13, the optical element 3 shown in FIGS. 7A and 7B may be sealed with the sealing resin 9. In this case, the optical element 3 can be integrated with the substrate 1 by means of the sealing resin 9, thus the adhesive 5 for bonding the optical element 3 to the substrate 1 can be omitted.

In the structure shown in FIG. 12, it is preferable that the adhesive 5 used for bonding the protuberance 3c to the substrate 1 be left as is to avoid a problem described below. That is, if the adhesive 5 is omitted from the structure shown in FIG. 12, a clearance will form between the protuberance 3c and the substrate 1. Such a clearance will be filled with the sealing resin 9. If the sealing resin 9 expands in response with the change of the environment where the imaging device is used, there arises stress which attempts to separate the optical element 3 from the imaging element 2, thereby accelerating deterioration of quality of the imaging element. Accordingly, when the optical element 3 is secured to the substrate 1 through use of the sealing resin 9, a determination must be made as to whether or not the adhesive 5 is to be omitted, depending on whether or not the protuberance 3c is provided on the optical element 3.

In the present embodiment, the adhesive 5 does not function to bond the substrate 1 and the optical element 3 into a single piece, but functions to prevent entry of the sealing resin 9 into the clearance between the substrate 1 and the optical element 3. In this respect, the adhesive 5 serves as means for stabilizing the quality of an imaging device not only in the construction shown in FIG. 12, but also in that shown in FIG. 13.

As mentioned above, the fifth embodiment is based on the imaging device shown in the first through fourth embodiments and relates to a method of integrating the optical element 3 with the substrate 1 through use of a resin such as the light-shielding sealing resin 9.

Sixth Embodiment

An imaging device according to a sixth embodiment of the present invention will be described by reference to FIGS. 14 through 21. Constituent elements common to the drawings are assigned the same reference numerals, and repeated explanations thereof are omitted.

Figure 14:
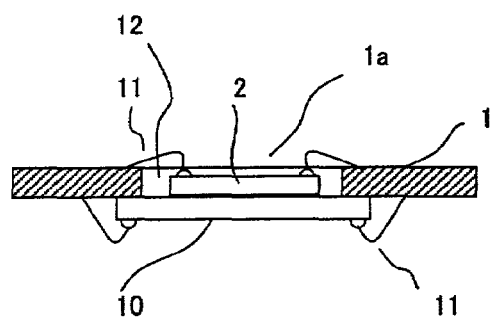
FIG. 14 is a cross-sectional view of an imaging device according to a sixth embodiment of the present invention.

As shown in FIG. 14, reference numeral 1 designates a circuit board having the opening section 1a formed therein; 2 designates an imaging element; 10 designates a peripheral element such as an application-specific integrated circuit (ASIC) tailored to a specific application, or a digital signal processor (DSP) for image processing; and 11 designates a wire for electrically connecting the imaging element 2 and the peripheral element 10 to the circuit board 1 by means of the wire bonding technique.

In the present embodiment, the peripheral element 10 is provided so as to close the opening section 1a formed in the substrate 1. As a result, a cavity (recess) 12 enclosed by the peripheral element 10 is formed in the substrate 1. The imaging device according to the present embodiment is characterized in that the imaging element 2 is provided in the cavity 12.

Figure 15A:
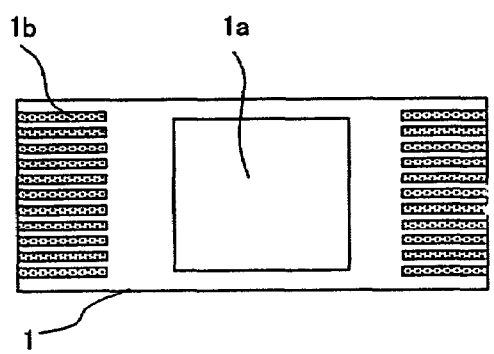
FIG. 15A is a plan view of a substrate employed in the imaging device according to the sixth embodiment of the present invention.
Figure 15B:
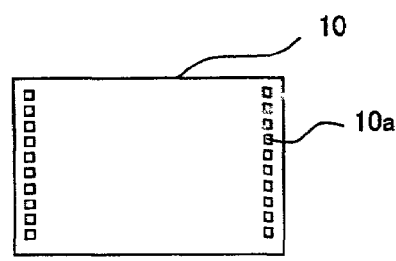
FIG. 15B is a plan view of a peripheral element employed in the imaging device according to the sixth embodiment of the present invention.

FIGS. 15A and 15B are plan views showing the substrate 1 and the peripheral element 10. In the drawings, reference 1a designates an opening section formed in the substrate 1;

1b designates a circuit pattern laid on the substrate 1; and 10a designates I/O terminals provided on the peripheral element 10.

The opening section 1a of the substrate 1 is smaller than the upper surface of the peripheral element 10. The I/O terminals 10a of the peripheral circuit 10 and the circuit patterns 1b, which are arranged in a one-to-one electrical relationship, are arranged so that they can be electrically connected by means of wire bonding.

Figure 16:
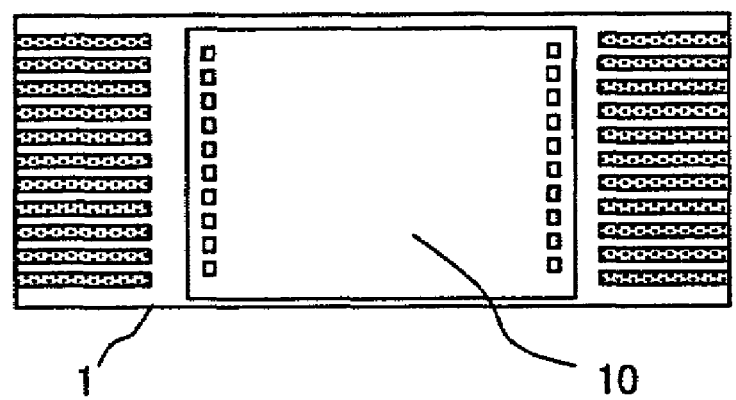
FIG. 16 shows the substrate having the peripheral element mounted thereon when viewed from the peripheral element.
Figure 17:
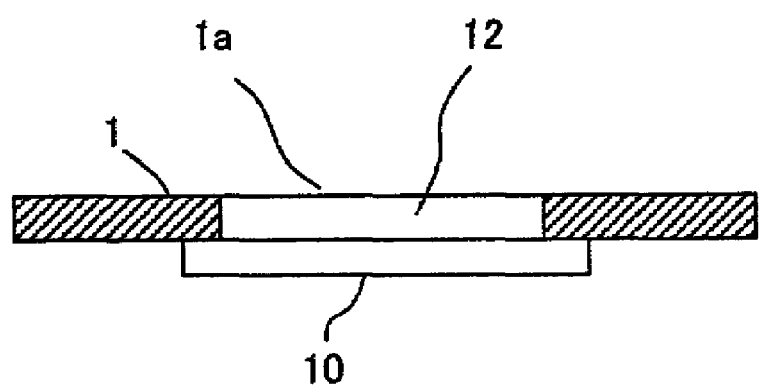
FIG. 17 is a cross-sectional view showing the structure shown in FIG. 16.

FIG. 16 shows the substrate 1 having the peripheral element 10 mounted thereon when viewed from the peripheral element 10. As illustrated, the peripheral element 10 is mounted on the substrate 1 so as to close the opening section 1a. FIG. 17 is a side cross-sectional view showing the structure shown in FIG. 16. As shown in FIG. 17, the cavity 12 is formed behind the peripheral element 10 closing the opening section 1a.

FIG. 18A is a plan view showing the substrate 1 and the peripheral element 10 shown in FIG. 16 when viewed from the back of the structure shown in FIG. 16. FIG. 18B is a plan view showing the imaging element 2 to be housed in the cavity 12 formed from the peripheral element 10 and the substrate 1. The opening section 1a of the substrate 1 is formed so as to become wider than the upper surface of the imaging element 2, so that the imaging element 2 can be embedded in the cavity 12.

As shown in FIG. 19, the imaging element 2 is disposed within the cavity 12 and is directly stacked on and fastened to the back of the hatched peripheral element 10.

In the present embodiment, the imaging element 2 and the peripheral element 10 are bonded together directly without interposition of the substrate 1. Further, the imaging element 2 is housed in the cavity 12 formed in the substrate 1, thereby obviating a necessity of a pre-package structure or the like. The structure of the imaging device according to the present embodiment enables miniaturization of the imaging device while component costs are diminished.

The peripheral element 10 and the substrate 1, which define the cavity 12, may be assembled by means of mounting the element 10 face down on the substrate 1 through FCB in the manner shown in FIG. 20. As shown in FIG. 20, reference numeral 4 designates bumps provided on each of the I/O terminals 10a of the peripheral element 10. The bumps 4 are electrically connected to the substrate 1 by means of FCB using an ACF.

The present invention is characterized in that, in a compact imaging device integrally containing the imaging element 2 and the peripheral element 10, the cavity 12 is defined by the peripheral element 10 and the opening section 1a formed in the substrate 1. So long as this characteristic can be achieved, no limitation is imposed on the method of mounting the peripheral element 10.

The present invention is not limited to the structure in which a single imaging element 2 and a single peripheral element circuit are stacked. As shown in FIGS. 21A through 21F, a single imaging element 2 and two peripheral elements 10 and 13 may be stacked. Thus, no limitation is imposed on combination of elements. Further, the substrate 1 may be configured such that the cavity 12 is provided with steps, as shown in FIG. 21E or 21F, so long as the cavity 12 can be formed as a result of mounting of the peripheral elements 10 and 13 and the imaging element 2.

Seventh Embodiment

Next, an imaging device according to a seventh embodiment of the present invention will be described by reference to FIGS. 22A and 22B. In FIGS. 22A and 22B, those elements which are identical with elements shown in FIGS. 21A and 21B are assigned the same reference numerals, and repeated explanations thereof are omitted.

Figure 21A:
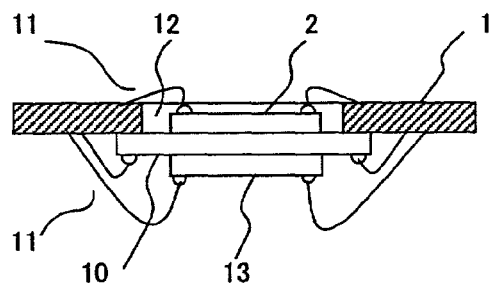
FIGS. 21A through 21F are cross-sectional views showing modified examples of the imaging device according to the sixth embodiment.
Figure 21B:
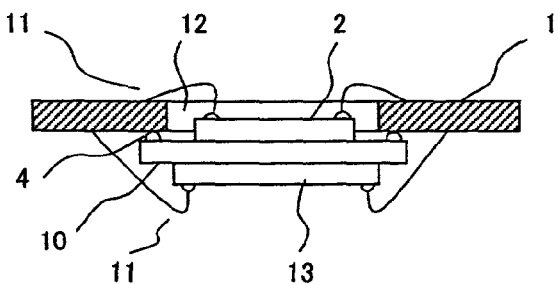
Figure 21C:
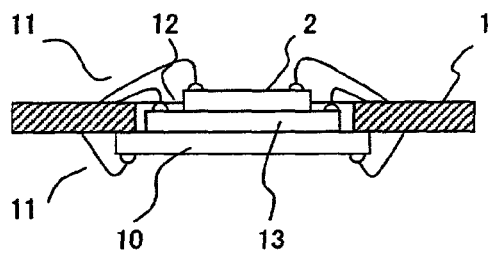
Figure 21D:
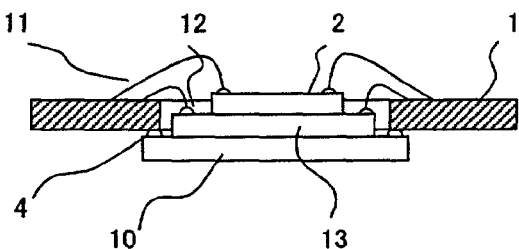
Figure 21E:
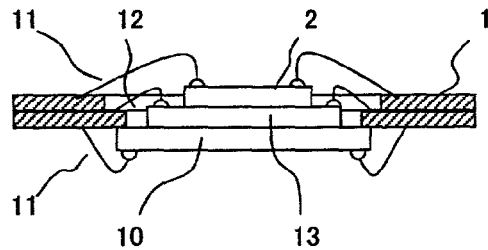
Figure 21F:
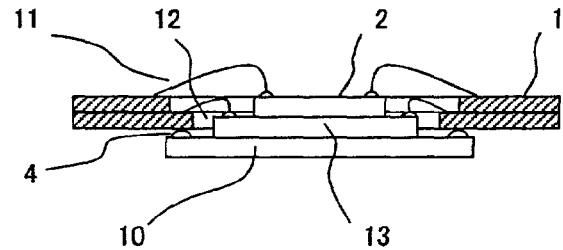
Figure 22A:
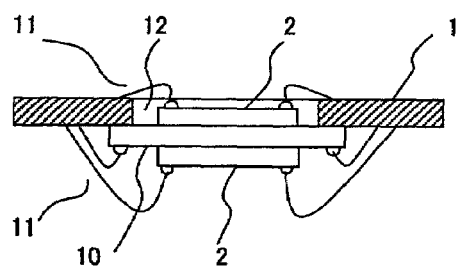
FIGS. 22A and 22B are cross-sectional views of imaging devices according to a seventh embodiment of the present invention.
Figure 22B:
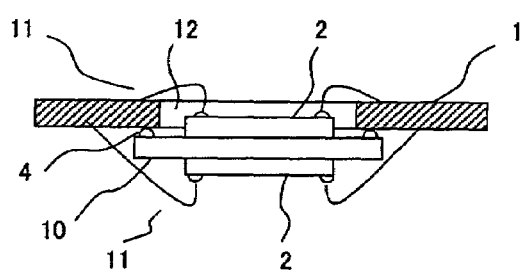

The structure shown in FIGS. 22A and 22B is identical with that shown in FIGS. 21A and 21B in that the peripheral element 10 closes the opening section of the substrate 1, thereby defining the cavity 12. The former structure differs from the latter structure in that the imaging element 2 is provided on either side of the peripheral element 10.

Some of imaging devices are provided to a portable terminal equipments so as to be able to photograph an image located in the opposite direction by rotating. The structure according to the present embodiment eliminates a necessity for a mechanism provided in a portable terminal equipment for rotating the imaging device and enables photographing of images located in two directions, thereby miniaturizing a portable terminal equipment requiring a two-way photographing capability.

Eighth Embodiment

Figure 23A:
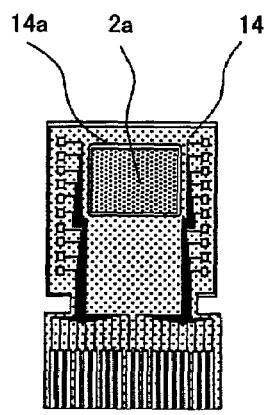
FIG. 23A is a plan view of an imaging device according to an eighth embodiment of the present invention.
Figure 23B:
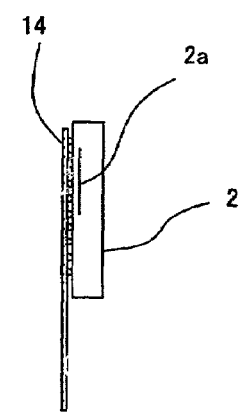
FIG. 23B is a side view of the imaging device according to the eighth embodiment of the present invention.

Next, an imaging device according to an eighth embodiment of the present invention will be described by reference to FIGS. 23A and 23B. In FIGS. 23A and 23B, reference numeral 2 designates an imaging element; 2a designates a light-receiving surface provided on the imaging element 2; 14 designates a film-like substrate having a circuit pattern formed thereon; and 14a designates an opening section formed in the film-like substrate 14.

Figure 24A:
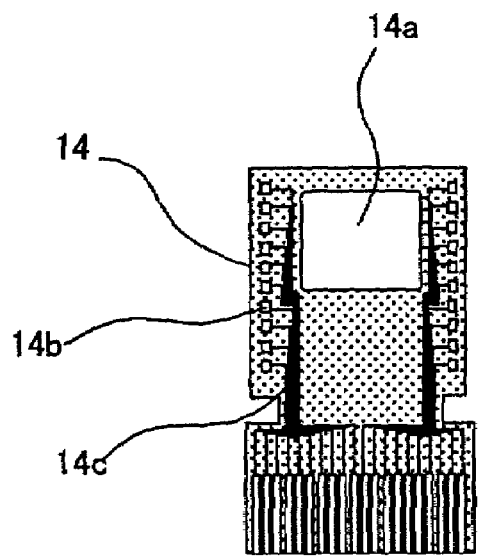
FIG. 24A is a plan view of a film-like substrate employed in the imaging device according to the eighth embodiment of the present invention.
Figure 24B:
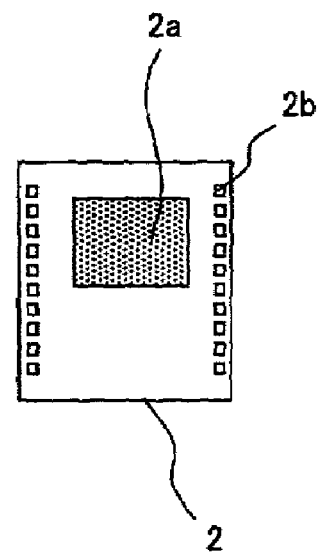
FIG. 24B is a plan view of an imaging element employed in the imaging device according to the eighth embodiment of the present invention.

FIGS. 24A and 24B are views showing the film-like substrate 14 and the imaging element 2, respectively, when the imaging device shown in FIGS. 23A and 23B according to the present embodiment is disassembled. As shown in FIG. 24A, reference numeral 14b designates lands for establishing electrical connection with the imaging element 2, and 14c designates a circuit pattern in which lines and spaces (L/S) are formed at a fine pitch. The lands 14b are laid out so as to correspond to the respective I/O terminals 2b provided on the imaging element 2. The circuit pattern 14c is formed in the space defined between the opening section 14a and the lands 14b. The opening section 14a is set so as to be wider than the light-receiving surface 2a provided on the imaging element 2.

The imaging device according to the embodiment shown in FIGS. 23A and 23B is constituted by means of electrically connecting the imaging element 2 shown in FIG. 24B integrally with the film-like substrate 14 shown in FIG. 24A, by means of FCB.

In the present embodiment, the dimensions of the opening section 14a of the film-like substrate 14, those of the imaging element 2, and those of the light-receiving surface 2a of the imaging element 2 are designed in the manner as mentioned previously. No overlap exists between the light-receiving surface 2a and the opening section 14a, and the light-receiving surface 2a can receive optical information without being affected by the film-like substrate 14.

By means of the structure according to the present embodiment, the film-like substrate 14 of the imaging device exclusive of the input/output section to be used for establishing connection with the external circuit can be made equal in size with or slightly smaller in size than the plane outer dimensions of the imaging element 2. Thus, the structure is effective for miniaturizing the imaging device. For instance, the portion of the film-like substrate 14 to be overlapped with the imaging element 2 can be made smaller than the top area of the imaging element 2, when a line pitch of the circuit pattern 14c laid on the film substrate 14 is set to a value of 60 μm; ten I/O terminals 2b are provided on either longer side of the imaging element 2, whereby a total of twenty I/O terminals 2b are provided along the imaging element 2; a space between the I/O terminals 2b and the light-receiving surface 2a is set to a value of 400 μm.

In connection with the device according to the present embodiment, an example circuit configuration of the film-like substrate 14 has been described by reference to FIG. 24A. The present invention is not limited to such a circuit configuration; the film-like substrate 14 may be, for example, a multilayer circuit board.

Ninth Embodiment

Figure 25:
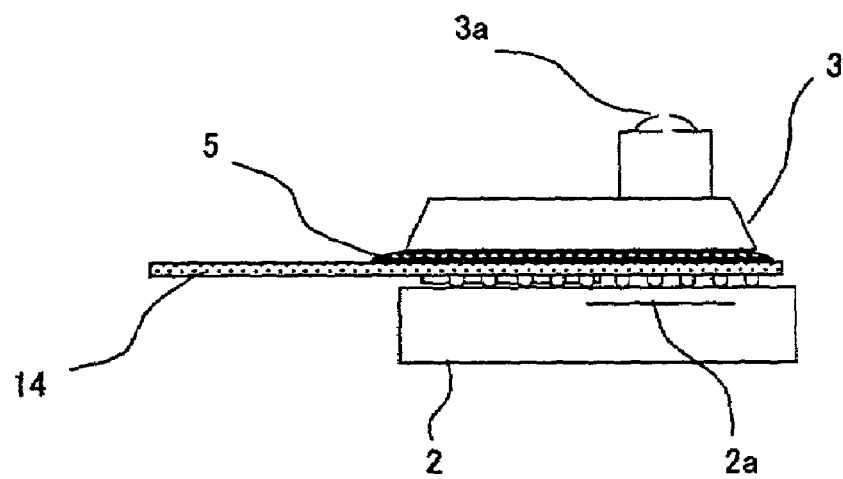
FIG. 25 is a side view of an imaging device according to a ninth embodiment of the present invention.

Next, an imaging device according to a ninth embodiment of the present invention will be described by reference to FIGS. 25 through 28B. FIG. 25 is a side view of an imaging device according to the present embodiment which comprises the structure shown in FIGS. 23A and 23B, wherein the optical element 3 having the imaging lens section 3a is incorporated. Here, the optical element 3 is assembled so as come into contact with the area of the imaging element 2 other than the light-receiving section 2a, by way of the opening section 14a formed in the film-like substrate 14. The optical element 3 and the film-like substrate 14 are assembled into a single piece by means of the adhesive 5. In FIG. 25, those elements which are identical with elements shown in FIG. 23 are assigned the same reference numerals, and repeated explanations thereof are omitted.

Figure 26A:
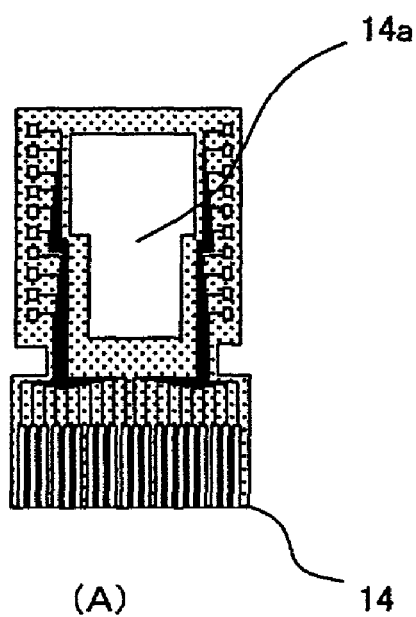
FIG. 26A shows a film-like substrate employed in the ninth embodiment of the present invention.
Figure 26B:
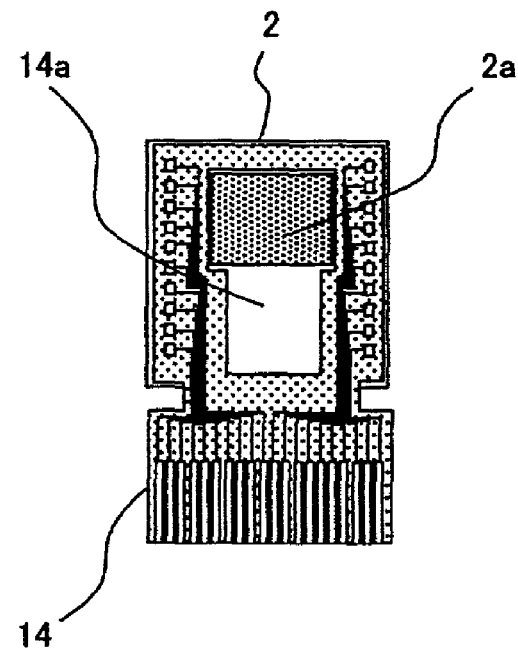
FIG. 26B is a plan view showing an imaging element mounted on the film-like substrate shown in FIG. 26A.

FIG. 26A shows the film-like substrate 14 employed in the present embodiment, and FIG. 26B is a plan view showing the imaging element 2 mounted on the film-like substrate 14. In FIGS. 26A and 26B, reference numeral 14a designates an opening section formed in the film-like substrate 14, and 2a designates a light-receiving surface provided on the imaging element 2.

Figure 27A:
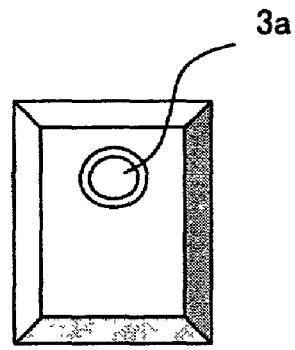
FIG. 27A is a plan view of an optical element having an imaging lens section employed in the ninth embodiment of the present invention.
Figure 27B:
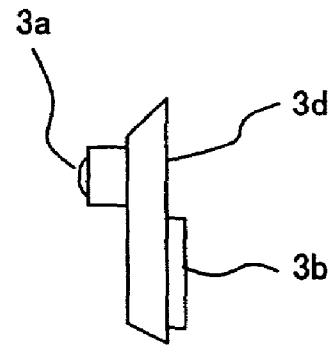
FIG. 27B is a side view of an optical element having an imaging lens section employed in the ninth embodiment of the present invention.

FIGS. 27A and 27B show the optical element 3 having the imaging lens section 3a employed in the present embodiment. In FIGS. 27A and 27B, reference numeral 3b designates a reference surface to be brought into contact with the imaging element 2, and 3d designates an adhesion surface. In the present embodiment, the optical element 3 is designed such that a clearance is formed between the adhesion surface 3d of the optical element 3 and the upper surface of the film-like substrate 14 in a state in which the optical element 3 is assembled without involvement of interference between the opening section 14a of the film-like substrate 14 and the reference surface 3b of the optical element 3.

Figure 28A:
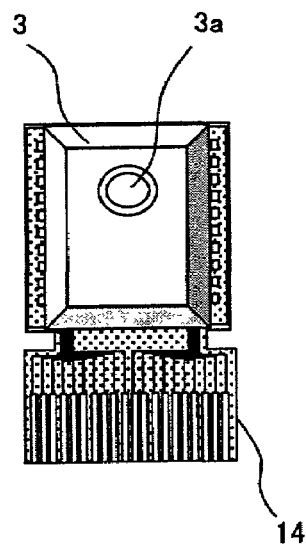
FIG. 28A is a plan view of the optical element secured on the imaging element employed in the ninth embodiment.
Figure 28B:
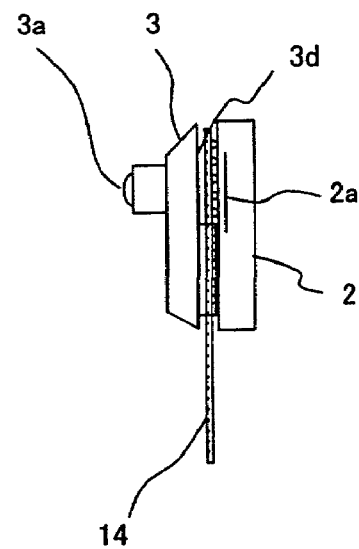
FIG. 28B is a side view of the optical element secured on the imaging element employed in the ninth embodiment.

FIGS. 28A and 28B show the optical element 3 secured on the imaging element 2. In the drawings, the reference surface 3b of the optical element 3 is in contact with the area of the imaging element 2 other than the light-receiving surface 2a. A clearance is formed between the adhesion surface 3d of the optical element 3 and the film-like substrate 14. In this structure, the position of the reference surface 3b on the optical element 3 is determined so as not to affect the optical information received by the light-receiving surface 2a by way of the imaging lens 3a.

According to the structure of the present embodiment, the optical element 3 can be assembled by way of the opening section 14a formed in the film-like substrate 14 while taking the upper surface of the imaging element 2 as a reference such that the heightwise accuracy of the optical element 3 becomes stable. For this reason, in the present embodiment, the heightwise accuracy between the imaging lens section 3a formed in the optical element 3 and the light-receiving surface 2a formed on the imaging element 2; that is, the accuracy of focus, can be made stable, thereby facilitating assembly of a compact imaging device using a fixed focal point.

Tenth Embodiment

Figure 29A:
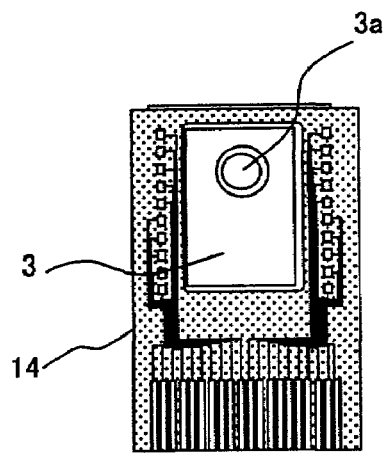
FIG. 29A is a plan view of an imaging device according to a tenth embodiment of the present invention.
Figure 29B:
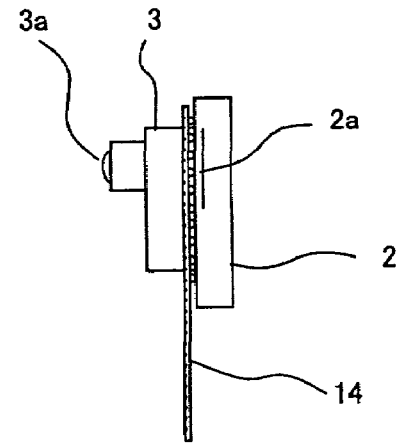
FIG. 29B is a side view of the imaging device according to the tenth embodiment of the present invention.

An imaging device according to a tenth embodiment of the present invention will be described by reference to FIGS. 29A through 31. In FIGS. 29A and 29B, those elements which are identical with elements shown in FIGS. 28A and 28B are assigned the same reference numerals, and repeated explanations thereof are omitted. The imaging device according to the present embodiment shown in FIGS. 29A and 29B employs an optical element 3 having the imaging lens section 3a, wherein the optical element 3 surrounds the light-receiving surface 2a of the imaging element 2 as in the case shown in FIGS. 7A and 7B.

In FIGS. 30A and 30B, reference numeral 14 designates a film-like substrate, and 2 designates an imaging element. FIG. 30C shows the film-shaped substrate 14 having the imaging element 2 integrally mounted face down thereon. As illustrated, in the present embodiment, the circuit pattern 14c of the film-like substrate 14 is separately provided along each row of circuit patterns 14b. Such layout of the circuit patterns 14c makes the opening section 14a wider than that formed in the eighth embodiment. For this reason, the structure of the device according to the present embodiment can effectively prevent occurrence of interference between the opening section 14a of the film-like substrate 14 and the reference surface 3b of the optical element 3 (corresponding to a hatched area shown in FIG. 7B).

In FIGS. 30A and 30B, those elements which are identical with elements shown in FIGS. 26A through 29B are assigned the same reference numerals, and repeated explanations thereof are omitted. As in the case of the eighth embodiment, also in the present embodiment attention is paid to the relative positional relationship between the opening section 14a and the light-receiving surface 2a and the relative positional relationship between the circuit pattern 14b and the I/O terminals 2b. Further, an interconnection rule pertaining to lines and spaces of the circuit pattern 14c is identical with that employed in the eighth embodiment. Therefore, repeated explanation of the rule is omitted here.

In the present embodiment, the optical element 3 can be positioned so as to surround the light-receiving surface 2a of the imaging element 2 while the planar size of the film-like substrate 14 is minimized. Such layout of the optical element 3 prevents entry of extraneous substances into the device via the areas indicated by arrows shown in FIG. 31, thus accelerating miniaturization of an imaging device. In FIG. 31, those elements which are identical with elements shown in FIGS. 29A and 29B are assigned the same reference numerals, and repeated explanations thereof are omitted.

Eleventh Embodiment

Figure 32:
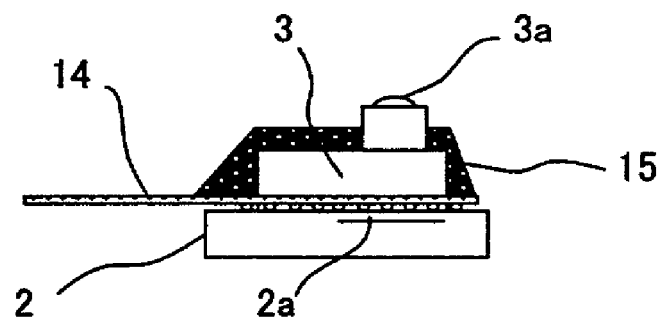
FIG. 32 is a cross-sectional view of an imaging device according to an eleventh embodiment of the present invention.
Figure 33:
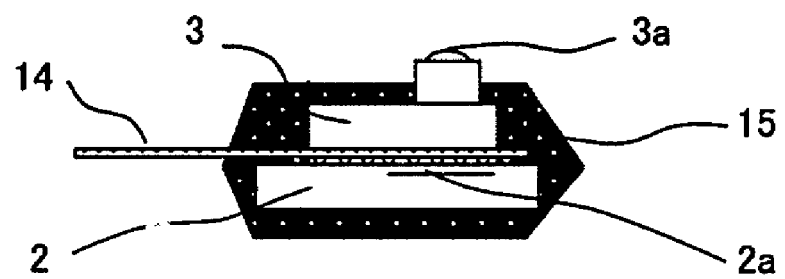
FIG. 33 is a cross-sectional view of another imaging device according to the eleventh embodiment of the present invention.

Next, an imaging device according to an eleventh embodiment of the present invention will be described by reference to FIGS. 32 and 33. As shown in FIG. 32, the imaging device according to the present embodiment is packaged by means of sealing resin 15. In FIG. 32, those elements which are identical with elements shown in FIG. 29 are assigned the same reference numerals, and repeated explanations thereof are omitted.

In the present embodiment, the geometry of the optical element 3 is made identical with that of the optical element 3 employed in the tenth embodiment, thereby preventing entry of extraneous substances into the device from the areas designated by the arrows shown in FIG. 31. By means of such a structure, even when the sealing resin 15 is provided on one side of the film-like substrate 14, as shown in FIG. 32, the sealing resin 15 will not be squeezed out to the light-receiving surface 2a of the imaging element 2. Accordingly, an adhesive to be used for bonding together the optical element 3 and the film-like substrate 14 is obviated, thereby diminishing the number of processes, and thus accelerating curtailment of costs of an imaging device.

If light-shielding resin is used as the sealing resin 15, a necessity of sheathing the imaging device with a light-shielding cover is obviated, thereby enabling saving of components. Further, as shown in FIG. 33, the entire imaging device may be molded with the sealing resin 15, which facilitates handling of materials (M/H) in a production line, thereby improving process quality and curtailing production costs.

Twelfth Embodiment

Figure 34:
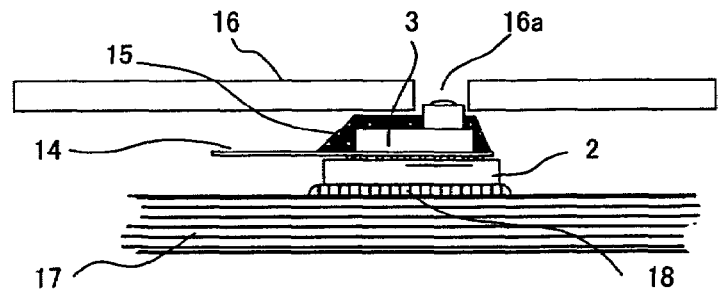
FIG. 34 is a cross-sectional view of an imaging device according to a twelfth embodiment of the present invention.

Next, an imaging device according to a twelfth embodiment of the present invention will be described by reference to FIG. 34 and FIGS. 35A and 35B. FIG. 34 shows a board of a portable terminal equipment or a like having an imaging device mounted thereon, wherein the imaging element has a bare back surface as shown in FIG. 32. In FIG. 34, reference numeral 16 designates a housing of a portable terminal equipment; 16a designates an opening section formed in the housing; and 17 designates a terminal board. The imaging device is fastened to the terminal board 17 by means of an elastic adhesive 18. The position where the imaging device is to be fastened is designed such that an opening section 16a formed in the housing 16 of a portable terminal equipment matches the position of the imaging lens section 3a of the imaging device. Accordingly, the imaging device can acquire optical information by way of the opening section 16a. In FIG. 34, those elements which are identical with elements shown in FIG. 32 are assigned the same reference numerals, and repeated explanations thereof are omitted.

It is expected that during transport various external forces will be imposed on a portable terminal equipment equipped with a compact imaging device. For instance, it must be expected that external force will be imposed so as to press the opening section 16a formed in the housing 16. Moreover, since an imaging device is to be used with a portable terminal equipment, demand exists for miniaturization. The imaging device shown in FIG. 32 enables a reduction in the heightwise dimension of the imaging device as compared with the imaging device shown in FIG. 33. However, since the back surface of the imaging element is bare, the structural strength of the device becomes weak in that structure. For this reason, in a case where the structure shown in FIG. 32 is employed, the imaging element 2 becomes more susceptible to damage when external force, such as that mentioned above, is applied to the opening section 16a of the housing, as compared with the case where the imaging device of the structure shown in FIG. 33 is employed.

The structure according to the present embodiment enables the elastic adhesive 18 to be used for fastening the imaging device to the terminal substrate 17 to function as a cushioning material. For instance, in the event that external force such as that designated by arrows shown in FIG. 35A or 35B is exerted on the imaging device, the adhesive 18 can absorb the external force to a certain extent. Hence, the structure of the imaging device according to the present embodiment enables a reduction in the frequency of failure of an imaging device after the device has been provided in a portable terminal equipment.

Figure 35A:
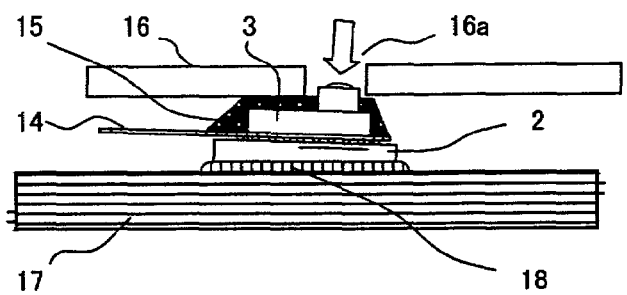
FIGS. 35A and 35B are schematic views showing a characteristic of the imaging device according to the twelfth embodiment of the present invention.
Figure 35B:
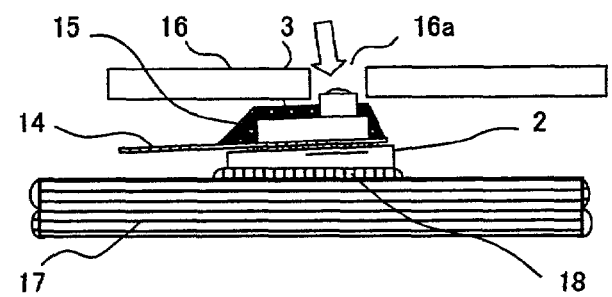

In FIGS. 35A and 35B, those elements which are identical with elements shown in FIG. 34 are assigned the same reference numerals, and repeated explanations thereof are omitted. Although omitted from the description of the present embodiment, in an actual portable terminal equipment a cover glass may be placed on the opening section 16a of the housing 16. In any event, the structure of the imaging device according to the present embodiment enables an improvement in the quality of a portable terminal equipment.

Thirteenth Embodiment

Figure 36:
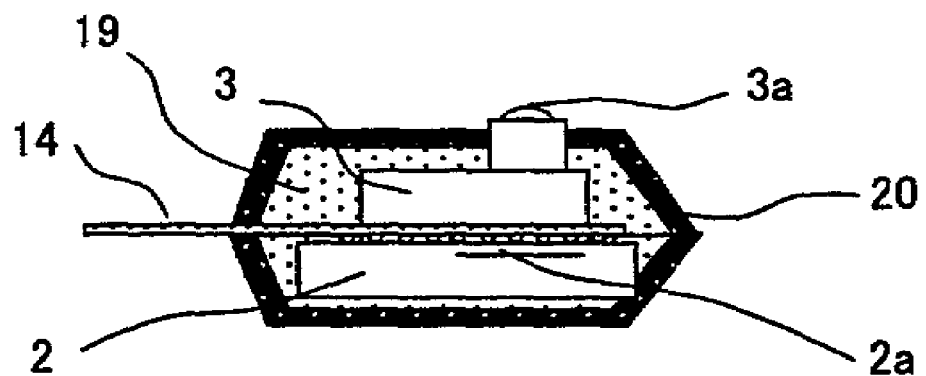
FIGS. 36 through 38 are cross-sectional views for describing a structure of an imaging device according to a thirteenth embodiment of the present invention.

Next, an imaging device according to a thirteenth embodiment of the present invention will be described by reference to FIGS. 36 through 38. In FIG. 36, those elements which are identical with elements shown in FIG. 32 are assigned the same reference numerals, and repeated explanations thereof are omitted. As shown in FIG. 36, the imaging device according to the present embodiment is characterized in that a radio wave shielding material 20 is provided outside sealing resin 19.

Figure 37:
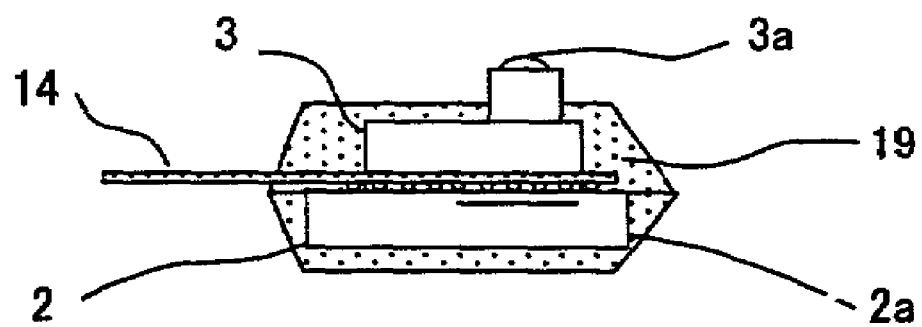

In FIG. 37, reference numeral 19 designates sealing material. The sealing material 19 is primarily intended for protecting a semiconductor element or other elements from entry of moisture or extraneous substances from the outside; preventing fracture of a semiconductor element, which would otherwise be induced by external force; assembling a semiconductor element and an optical element in a single piece, particularly in the present embodiment; and implementing desired light-shielding capability.

Figure 38:
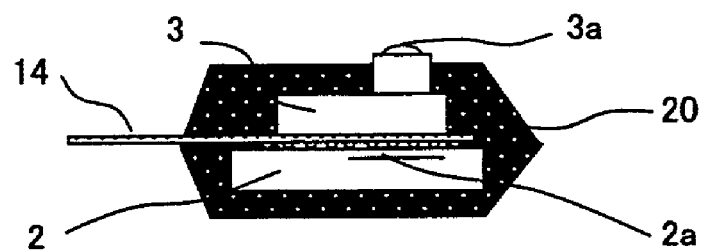

FIG. 38 shows the imaging device which has comprises the component shown in FIG. 37 and the radio wave shielding material 20 coated on the component with the exception of the imaging lens section 3a. In FIGS. 37 and 38, those elements which are identical with elements shown in FIG. 36 are assigned the same reference numerals, and repeated explanations thereof are omitted.

The compact imaging device provided by the present invention is suitable for use with a portable terminal equipment. For instance, a terminal equipment having communications capability, such as a portable cellular phone, produces a high-frequency radio wave, and radio noise may adversely affect the function of the imaging device. In the imaging device according to the present embodiment, a compact imaging device can be activated without being affected by radio interference noise, even in a portable terminal equipment for communication purpose. Thus, the quality of a compact imaging device can be improved.

The present embodiment is characterized in that an imaging device for use with a portable terminal equipment having communication capability is provided with radio wave shielding means. The geometry and material of the shielding means are not limited to those set forth. For instance, the exterior of an imaging device may be coated with a radio wave shielding material, or sealing resin having a radio wave shielding property may be employed. Alternatively, an imaging device may be integrally molded as a separate component.

Fourteenth Embodiment

Figure 39A:
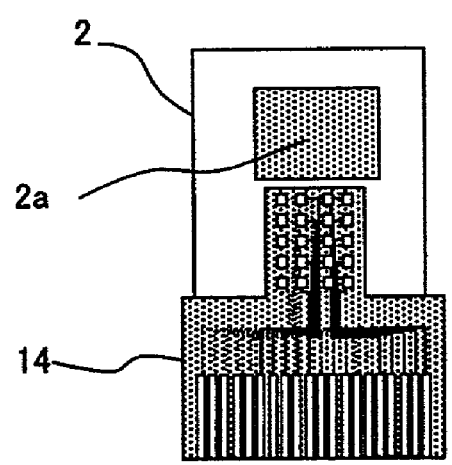
FIG. 39A is a plan view of an imaging device according to a fourteenth embodiment of the present invention.
Figure 39B:
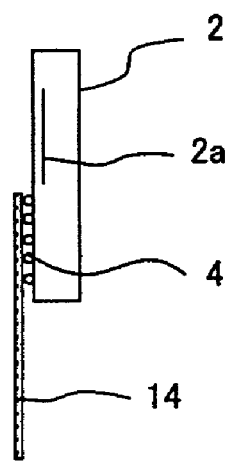
FIG. 39B is a side view of the imaging device according to the fourteenth embodiment of the present invention.

Next, an imaging device according to a fourteenth embodiment of the present invention will be described by reference to FIGS. 39A through 41B. As shown in FIGS. 39A and 39B, the layout of circuitry of the imaging element 2 is changed such that the I/O terminal sections are located in the vicinity of the center of the imaging element 2. The I/O terminal sections are electrically connected, through use of an ACF by way of the bumps 4, to the land sections of the circuit pattern of the film-like substrate 14 located so as to correspond to the I/O terminal sections.

Figure 40A:
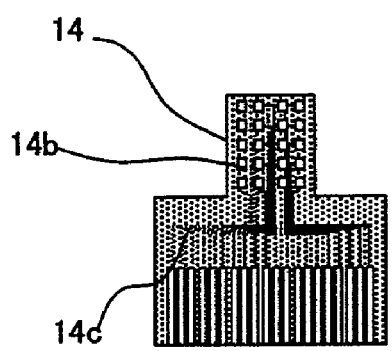
FIG. 40A is a plan view of a film-like substrate employed in the fourteenth embodiment of the present invention.
Figure 40B:
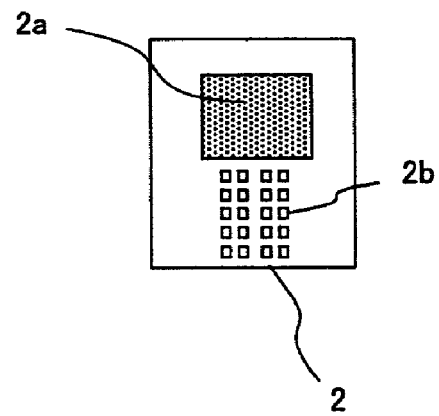
FIG. 40B is a plan view of an imaging device employed in the fourteenth embodiment of the present invention.

FIGS. 40A and 40B are exploded views of the film-like substrate 14 and the imaging element 2 shown in FIGS. 39A and 39B. In the drawings, reference numeral 14b designates land sections of a circuit pattern laid on the film-like substrate 14; 14c designates a circuit pattern; and 2b designates I/O terminals provided on the imaging element 2. The I/O terminals 2b are located not at the end, but in the center of the imaging element 2 in a concentrated manner.

The circuit pattern land sections 14b of the film-like substrate 14 and the I/O terminals 2b provided on the imaging element 2 are constructed such that they match in a one-to-one relationship when assembled in the manner as shown in FIGS. 39A and 39B. In FIGS. 39A to 40B, those elements which are identical with elements shown in FIGS. 23A to 24B are assigned the same reference numerals, and repeated explanations thereof are omitted.

One characteristic of the imaging device according to the present embodiment lies in that the I/O terminal sections 2b of the imaging element 2 are concentrated in a small region in the vicinity of the center of the imaging element 2, by means of circuit design. As a result, the area on the imaging element 2 occupied by the film-like substrate 14 can be reduced, thereby enabling miniaturization of an imaging device.

In order to embody the foregoing construction, the circuit pattern land sections 14b and the circuit patterns 14c of the film-like substrate 14 must also be integrated. If an L/S pitch is 25 µm, the contemporary circuit pattern formation technique encounters difficulty in laying out the circuit patterns 14c between the integrated land sections 14b. Therefore, in the present embodiment, the film-like substrate 14 is formed into a two-layer structure, thereby embodying the foregoing characteristic construction.

Figure 41A:
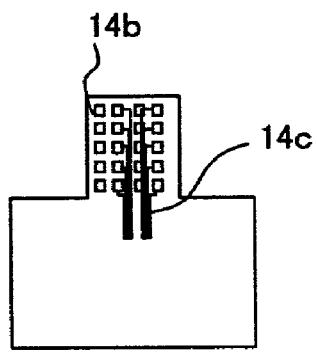
FIGS. 41A and 41B are views for describing a structure of the film-like substrate employed in the fourteenth embodiment of the present invention.
Figure 41B:
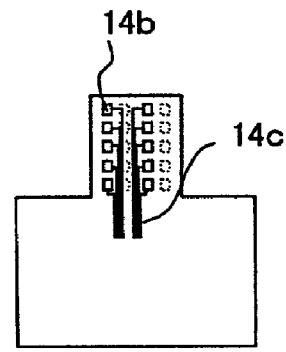

FIGS. 41A and 41B show the circuit pattern land sections 14b and the circuit pattern sections 14c provided on each layer of the above mentioned two-layer film-like substrates 14. In FIGS. 41A and 41B, those elements which are identical with elements shown in FIGS. 40A and 40B are assigned the same reference numerals, and repeated explanations thereof are omitted. FIGS. 41A and 41B show only the circuit patterns located in the vicinity of the circuit pattern land sections 14b, and the remaining portions of the circuit patterns are omitted from the drawings. The present embodiment enables a reduction in the dimensions of the film-like substrate 14, thereby accelerating miniaturization of an imaging device.

Fifteenth Embodiment

Figure 42A:
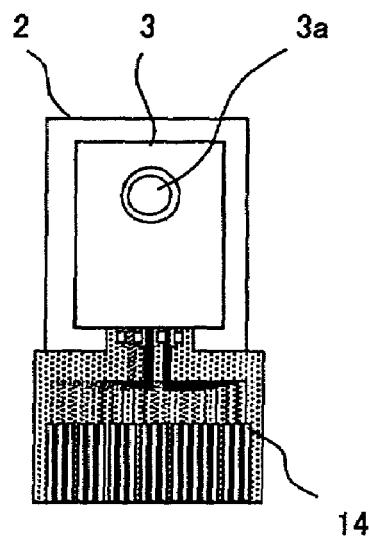
FIG. 42A is a plan view of an imaging device according to a fifteenth embodiment of the present invention.
Figure 42B:
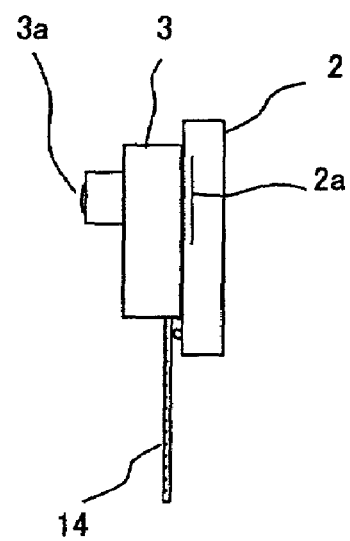
FIG. 42B is a side view of the imaging device according to the fifteenth embodiment of the present invention.

Next, an imaging device according to a fifteenth embodiment of the present invention will be described by reference to FIGS. 42A through 46. In FIGS. 42A and 42B, reference numeral 3 designates an optical element having the imaging lens section 3a. The film-like substrate 14 and the imaging element 2 are connected by means of the same technique as that employed in the fourteenth embodiment; more specifically, the technique shown in FIGS. 39A and 39B. In the present embodiment, the optical element 3 is bonded integrally to the imaging element 2 such that the optical element 3 straddles the connection between the film-like substrate 14 and the imaging element 2 and such that the heightwise accuracy of the optical element 3 is ensured by the optical element 3 coming into contact with a portion of the imaging element 2. In FIGS. 42A and 42B, those elements which are identical with elements shown in FIGS. 39A and 39B are assigned the same reference numerals, and repeated explanations thereof are omitted.

Figure 43A:
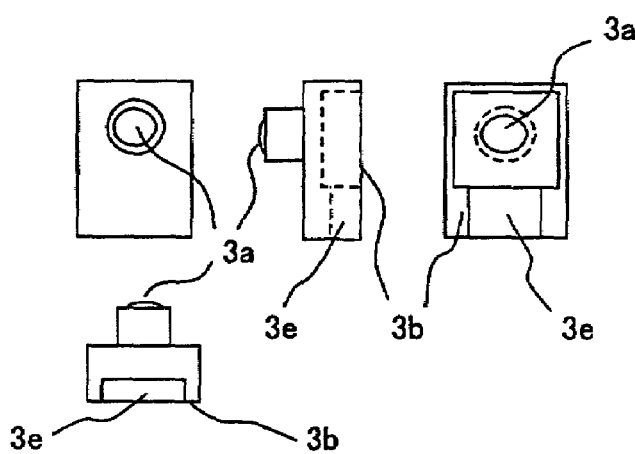
FIGS. 43A and 43B are views showing an optical element employed in the fifteenth embodiment of the present invention.
Figure 43B:
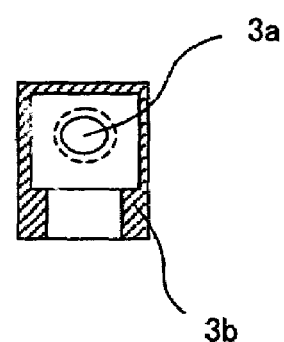

FIG. 43A show four views of the optical element 3 employed in the present embodiment. FIG. 43B shows the area on the imaging element 2 with which the optical element 3 comes into contact, by means of hatching. In the drawings, reference numeral 3a designates an imaging lens section; 3b designates a contact section to be brought into contact with the imaging element 2; and 3e designates a gate-shaped section for fastening purpose.

Figure 44:
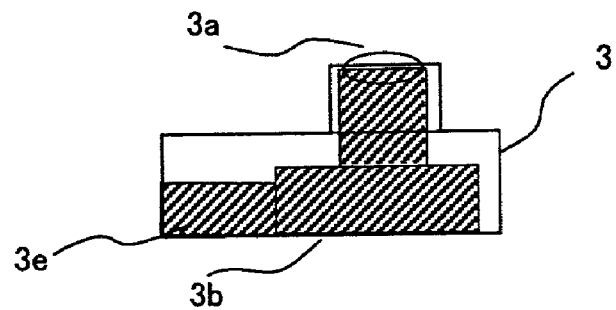
FIG. 44 is a cross-sectional view of the optical element employed in the fifteenth embodiment of the present invention.

FIG. 44 is a conceptual rendering showing the internal structure of the optical element 3 shown in FIGS. 43A and 43B. The hatched area shown in FIG. 44 is an internal space of the optical element 3. In FIG. 44, those elements which are identical with elements shown in FIGS. 43A and 43B are assigned the same reference numerals, and repeated explanations thereof are omitted. The present embodiment is characterized in that the optical element 3 has a space designated as the gate-shaped section 3e, and the presence or absence of a space other than the gate-shaped section 3e and the geometry of the space are not limited to the case shown in FIG. 44.

Figure 45A:
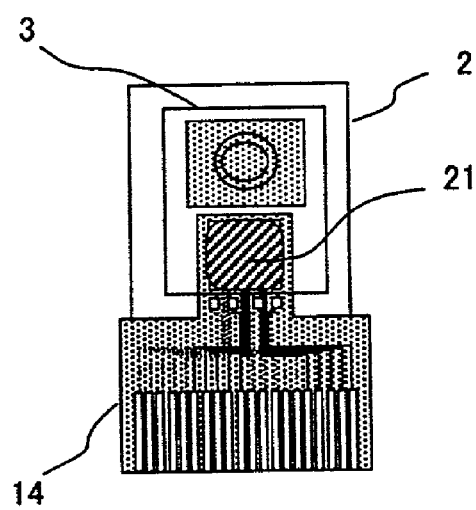
FIGS. 45A and 45B are perspective views for describing a structure of the imaging device according to the fifteenth embodiment of the present invention.
Figure 45B:
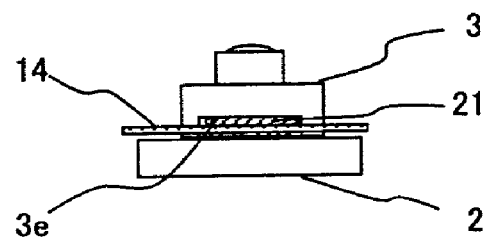
Figure 46:
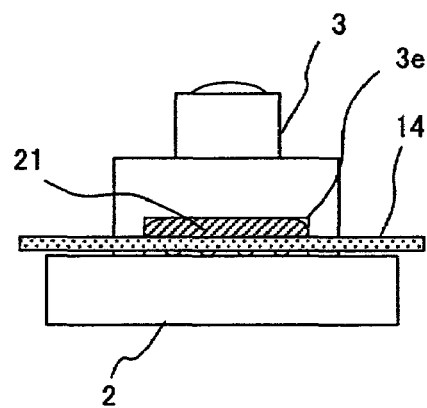
FIG. 46 is an enlarged perspective view of the imaging device according to the fifteenth embodiment.

In FIGS. 45A and 45B, reference numeral 21 designates an adhesive. The adhesive 21 is used for fastening, on the film-like substrate 14, the optical element 3 that has been assembled so as to contact with the imaging element 2 of the imaging device shown in FIGS. 39A and 39B. FIG. 46 is an enlarged view of the imaging device shown in FIG. 45B. As shown in FIG. 46, the optical element 3 is assembled while being brought into contact with the upper surface of the imaging element 2. The void defined between the gate-shaped section 3e and the film-like substrate 14 is filled with the adhesive 21, whereby the gate-shaped section 3e is bonded to the film-like substrate 14. In FIGS. 45A, 45B and 46, those elements which are identical with elements shown in FIGS. 42A and 42B are assigned the same reference numerals, and repeated explanations thereof are omitted.

The construction of the imaging device according to the present embodiment enables a reduction in the dimensions of the film-like substrate 14 and assembly of the optical element 3 including the imaging lens section 3a while the upper surface of the imaging element 2 is taken as a reference. Hence, the construction according to the present embodiment ensures high precision of focus of an imaging lens of fixed focus type, facilitates assembly of an imaging device, and accelerates miniaturization of an imaging device.

Sixteenth Embodiment

Figure 47:
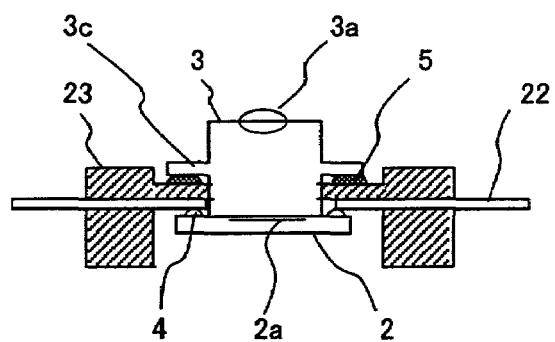
FIG. 47 is a cross-sectional view of an imaging device according to a sixteenth embodiment of the present invention.

A sixteenth embodiment of the present invention will now be described by reference to FIGS. 47 through 50. As shown in FIG. 47, the imaging device according to the present embodiment has a premolded package consisting of lead frames 22 and a premolded material 23. The imaging element 2 having the light-receiving surface 2a is assembled in a premolded package. The optical element 3 having the imaging lens section 3a is assembled so as to come into contact with the upper surface of the imaging element 2 by way of an opening section formed in the premolded package. The bump electrodes 4 are provided as electrodes on the I/O terminal sections of the imaging element 2. The imaging element 2 is electrically connected to the lead frames 22 by way of the bumps 4 and an ACF. Further, the optical element 3 and a premolded package are assembled into a single piece by means of the protuberance 3c provided on the optical element 3 being fastened to the premolded material 23 through use of the adhesive 5.

Figure 48A:
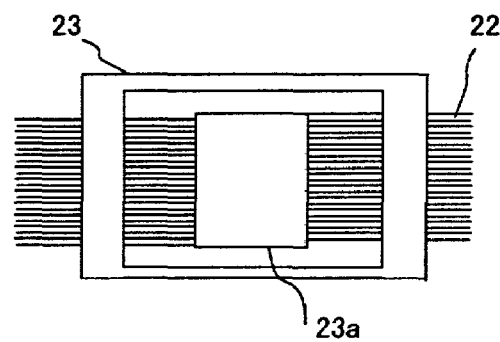
FIGS. 48A and 48B show the imaging device shown in FIG. 47 while being disassembled into a premolded material and an imaging element.
Figure 48B:
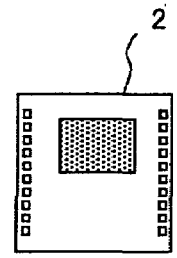

FIGS. 48A and 48B show the imaging device shown in FIG. 47 while being disassembled into a premolded package and an imaging element. In the drawings, reference numeral 23a designates an opening section formed in a premolded package; and 2 designates an imaging element. In the present embodiment, the lead frames 22 provided within a premolded package are arranged in one-to-one relationship with the I/O terminals formed on the imaging element 2. In FIGS. 48A and 48B, those elements which are identical with elements shown in FIG. 47 are assigned the same reference numerals, and repeated explanations thereof are omitted.

Figure 49A:
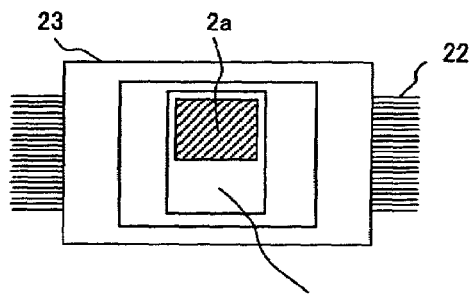
FIGS. 49A through 49D are views for describing a structure of the imaging device according to the sixteenth embodiment of the present invention.
Figure 49B:
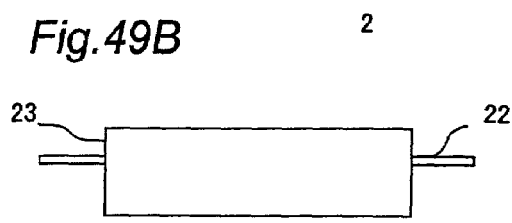
Figure 49D:
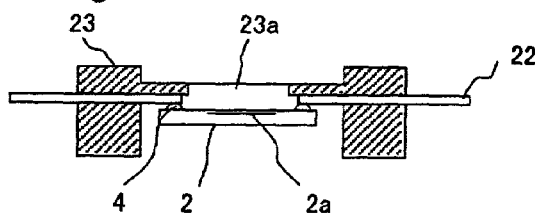
Figure 49C:
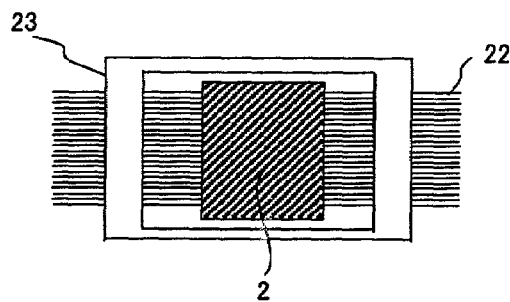

FIGS. 49A, 49B and 49C shows a plan view, a front view, and a bottom view of the imaging device according to the present embodiment, respectively. FIG. 49D is a cross-sectional view of the imaging device when viewed from the side. In the drawings, reference numeral 2a designates a light-receiving surface of the imaging element 2. As shown in FIG. 49D, the imaging element 2 is arranged so that the light-receiving surface 2a can acquire optical information from the outside by way of the opening section 23a formed in the premolded package.

Figure 50:
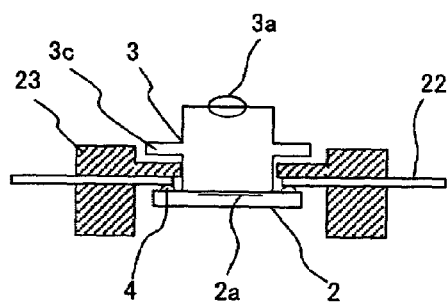
FIG. 50 is a cross-sectional view for describing a structure of the imaging device according to the sixteenth embodiment of the present invention.

FIG. 50 shows the optical element 3 mounted on top of the imaging element 2. As shown in FIG. 50, the optical element 3 is assembled so as to come into contact with the area on the imaging element 2 other than the light-receiving surface 2a, by way of the opening section of the premolded package. The optical element 3 is arranged so as not to come into contact with members such as the premolded package, exclusive of contact with the upper surface of the imaging element 2. A clearance is formed between the protuberance 3c of the optical element 3 and the premolded package. In FIGS. 49A to 49D and 50, those elements which are identical with elements shown in FIG. 47 or those shown in FIGS. 48A and 48B are assigned the same reference numerals, and repeated explanations thereof are omitted.

In the imaging device of premolded package structure according to the present embodiment, the optical element 3 is assembled while the upper surface of the imaging element 2 is taken as a reference. For this reason, in the present embodiment, the heightwise accuracy between the imaging lens section 3a formed in the optical element 3 and the light-receiving surface 2a formed on the imaging element 2; that is, the accuracy of focus, can be made stable. In the present embodiment, the optical element 3 and the premolded material 23 can be bonded together integrally, thereby facilitating assembly of a compact imaging device using a fixed focal point.

In the present embodiment, the optical element 3 and the premolded material 23 can be bonded integrally while the upper surface of the imaging element 2 is taken as a reference. Hence, there can be eliminated variations in the accuracy of assembly in the direction of focus ascribable to variations in the thickness of an adhesive. The present embodiment can yield an improvement in process quality and a reduction in failure costs involved in a production line.

In the construction shown in FIG. 47, the adhesive 5 used for assembling the optical element 3 and the premolded material 23 into a single package is placed at a position lower than the protuberance 3c of the optical element. However, the position where the adhesive is placed is not limited to the embodiment. For instance, the adhesive may be provided in a clearance formed between the side surface of the protuberance 3c and the premolded material 23.

Seventeenth Embodiment

Figure 51A:
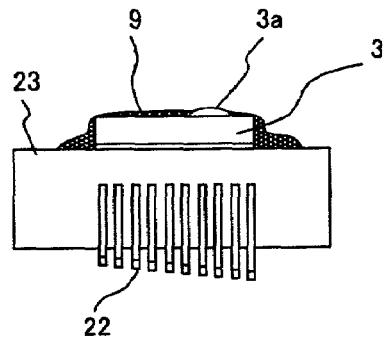
FIGS. 51A and 51B are side views of an imaging device according to a seventeenth embodiment of the present invention.
Figure 51B:
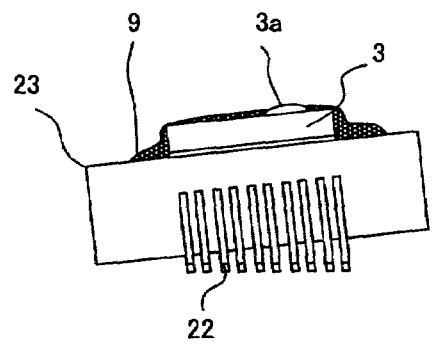

A seventeenth embodiment of the present invention will now be described by reference to FIGS. 51A through 55. FIGS. 51A and 51B are side views of an imaging device having a lead frame section such as that shown in FIG. 47. In FIGS. 51A and 51B, reference numeral 3 designates an optical element having the imaging lens section 3a; 9 designates sealing resin; 22 designates lead frames; and 23 designates a premolded.

Figure 52A:
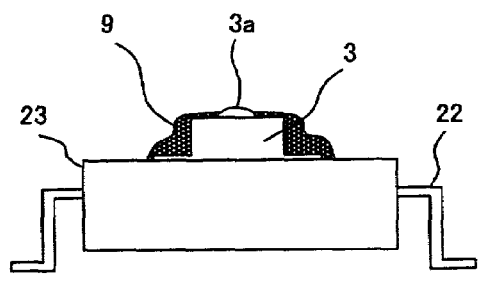
FIG. 52A is a front view showing an imaging device whose lead frame section has been cut and formed by a normal technique.
Figure 52B:
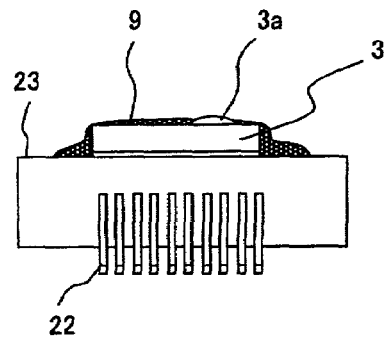
FIG. 52B is a side view of the imaging device shown in FIG. 52A.

FIG. 52A is a front view showing an imaging element whose lead frame section has been cut and formed by means of a predetermined die assembly. FIG. 52B is a side view showing an imaging element whose lead frame section has been cut and formed by a normal technique. As shown in FIG. 52B, all the lead frames 22 are usually cut and formed so as to assume substantially the same length.

The imaging device according to the present embodiment is characterized in that the lead frames 22 are cut and formed such that the lengths of the lead frames 22 gradually change from one end of the lead frame section to the other end. In this case, when the imaging device is placed on a horizontal plane, the imaging device is tilted in such a manner as shown in FIG. 51B. The angle of inclination can be freely adjusted in accordance with the design of a die assembly to be used for forming lead frames.

Figure 53A:
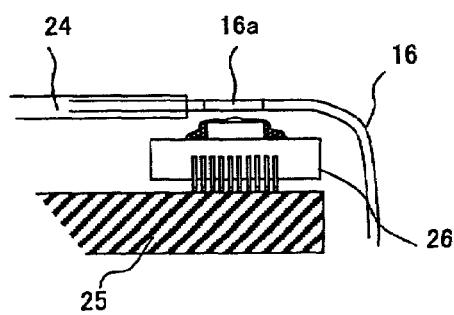
FIGS. 53A, 53B, 54 and 55 are figures for describing an advantageous result yielded by the imaging device according to the seventeenth embodiment.
Figure 53B:
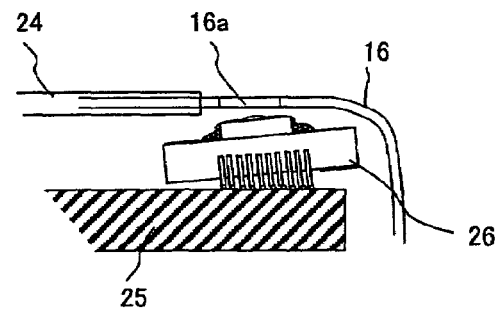

An advantage stemming from the foregoing characteristic will next be described by reference to FIGS. 53A, 53B and 54. In FIG. 53, reference numeral 16 designates a housing of a portable terminal equipment; 16a designates an opening section formed in the housing; 24 designates a display section provided on the portable terminal equipment; 25 designates a board of the portable terminal equipment; and 26 designates an imaging device.

When lead frames are formed by means of the normal technique, an imaging device 26 is mounted in parallel with the board 25 of the portable terminal equipment, as shown in FIG. 53A. In this case, the direction in which the imaging device 26 performs a photographing action is perpendicular to the board 25 of the portable terminal equipment.

When the lead frames are formed in compliance with the request of the present embodiment, the imaging device 26 is mounted on the board 25 of the portable terminal equipment in an inclined manner, as shown in FIG. 53B. In this case, the direction in which the imaging device 26 performs a photographing action is oriented toward a direction determined by a predetermined angle at which the lead frames 22 are formed; namely, a predetermined direction which is not perpendicular to the board 25 of the portable terminal equipment.

Figure 54:
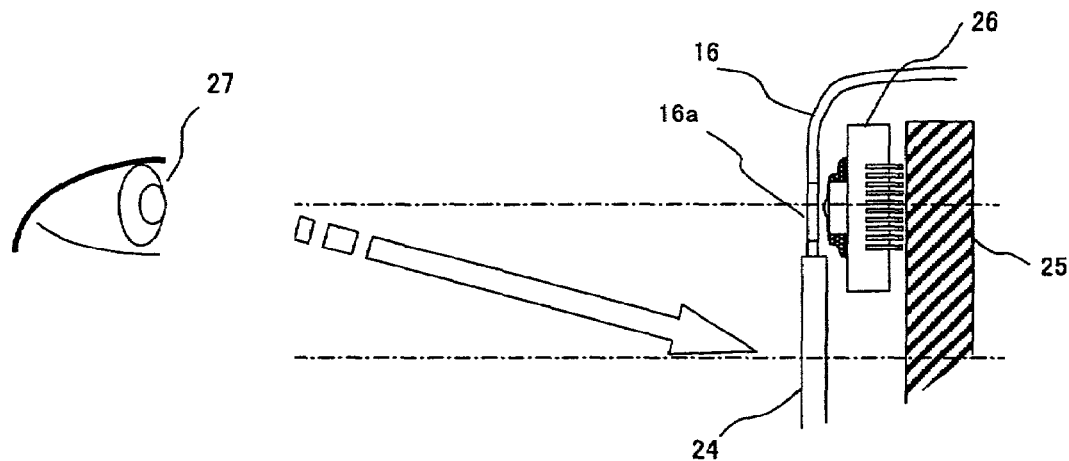

FIG. 54 shows a practical example of the portable terminal equipment shown in FIG. 53A. If the direction in which the imaging device 26 performs a photographing action is perpendicular to the board 25 of the portable terminal equipment, a discrepancy arises between the position of the eyes (view point) 27 of the user who attempts to visually recognize a display section 24 and the position of the display section 24. In this case, the following problems are encountered by the user in attempting to see a reflection of his face in the display device. More specifically, in this case, the user cannot see the display section 24 when attempting to align the line of sight to the imaging device 26. Further, when the user aligns his eyes to the display section 24, an image appearing on the display section 24 is perceived such that the eyes are slightly drooped. Further, in this case, it is difficult to set the user's position to the center of the screen of the display section 24.

Figure 55:
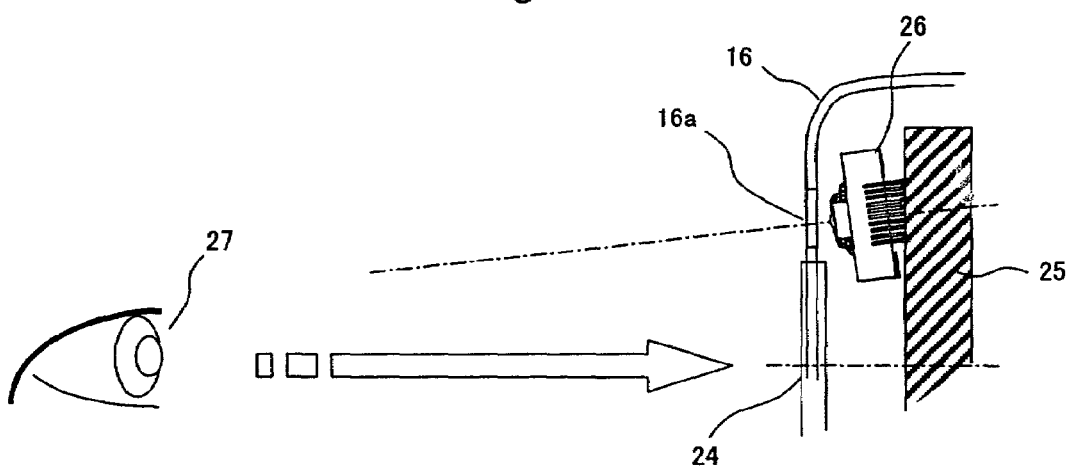

FIG. 55 shows an example of practical use of a portable terminal shown in FIG. 53B. In FIG. 55, the angle of inclination of the imaging device 26 is designed such that the user's eyes 27 are aligned with the position of the display section 24 at a predetermined distance. In this way, if the lead frames 22 are formed so as to realize the state shown in FIG. 55, a discrepancy between the position of the user's eyes 27 and the position of the display section 24 can be mitigated. In this case, the user can easily recognize his own image in the center of the screen of the display section 24.

Achieving the foregoing characteristic is important with regard to a compact portable terminal equipment such as a portable cellular phone, in which a limitation is imposed on the position and layout of the imaging device 26 and both of the imaging device 26 and the display device for displaying a photographed image are provided in the same plane. Although providing the imaging device 26 with a rotation mechanism is an effective measure, in this case, there may arise problems, such as a necessity of a mechanical structure and a failure to ensure sufficient strength capable of resisting shock resulting from dropping.

In contrast, the structure of the imaging device according to the present embodiment prevents an increase in the dimensions of a portable terminal equipment and an increase in the number of components, without providing a portable terminal equipment with a complicated rotation mechanism and enables an improvement in operability pertaining to the photographing capability of the portable terminal equipment while ensuring sufficient strength. In FIGS. 54 and 55, those elements which are identical with elements shown in FIGS. 53A and 53B are assigned the same reference numerals, and repeated explanations thereof are omitted.

Although the present embodiment has described the way to bend the lead frames 22 by reference to FIGS. 51A and 51B, the direction in which the lead frames 22 are to be bent is not limited to the thus-described direction. The present invention is characterized in that the direction in which the imaging device 26 performs a photographing operation after having been mounted on the substrate is determined by means of the way to bend the lead frames 22.

Eighteenth Embodiment

An eighteenth embodiment of the present invention will now be described by reference to FIGS. 56 through 60. The function of an imaging device according to the present embodiment is identical with that of the imaging device described in connection with the seventeenth embodiment. The difference between the present embodiment and the seventeenth embodiment lies in that the direction in which the imaging device mounted on a substrate performs a photographing action is determined not by the way to bend lead frames, but by the geometry of lead frames.

Figure 56:
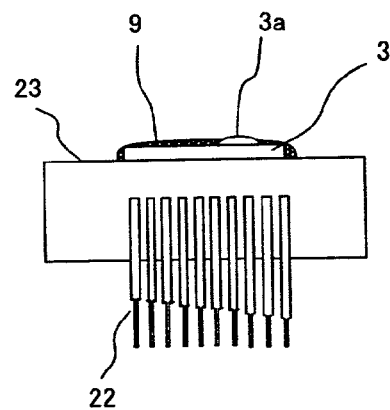
FIGS. 56 to 58, 59A, 59B and 60 are views of imaging devices according to an eighteenth embodiment of the present invention.
Figure 57:
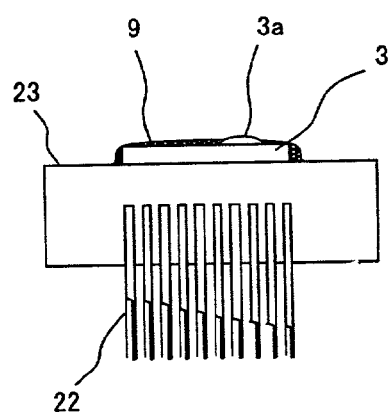
Figure 58:
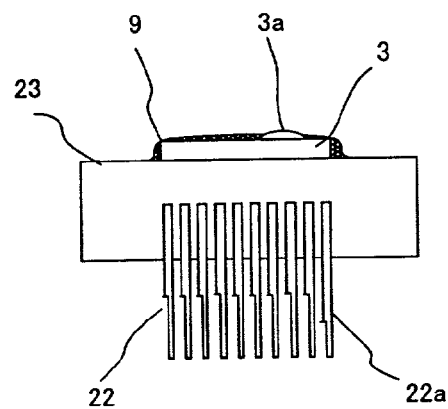

FIGS. 56 through 58 show examples of an imaging device according to the present embodiment, respectively. These imaging devices are mounted on a substrate by means of fitting lead frames into through holes in the substrate of a portable terminal equipment or engaging lead frames with connectors provided on the substrate.

As shown in FIG. 56, steps are formed in the lead frames 22 beforehand for limiting a depth to which the lead frames are to be fitted into the substrate. The steps provided on the individual lead frames 22 are changed stepwise. When the imaging device shown in FIG. 56 is mounted on the substrate or a like member, the imaging device is inclined for reasons of the change in the lengths of the steps, as shown in FIG. 53B.

As in the case of the imaging device shown in FIG. 56, the imaging device shown in FIG. 57 has the lead frames 22 whose steps are changed in length stepwise. In the imaging device shown in FIG. 56, each of the steps is formed by means of shaping the circumference of an individual lead frame 22 so as to cause the center portion of the lead frame to project. In contrast, in the imaging device shown in FIG. 57, the step is formed by means of causing the end of an individual lead frame 22 to protrude further than the remaining portion, and the step is inclined.

By means of the structure of the imaging device shown in FIG. 57, when the imaging device is mounted on the substrate, the steps of the lead frames 22, which are wider than those shown in FIG. 56 and are inclined at a predetermined angle, can be brought into contact with the substrate. Therefore, the structure shown in FIG. 57 enables an improvement in the accuracy of inclination of the imaging device after the device has been mounted on the substrate, as compared with the case of the structure shown in FIG. 56.

In an imaging device shown in FIG. 58, only a step of a lead frame 22a located at one end exists at a position closer to the tip end than do steps of the remaining lead frames 22. An imaginary line connecting the step of the lead frame 22a and the step of the lead frame 22 located at the other end defines an angle of inclination which will arise between the imaging device and the substrate when the imaging device is mounted on the substrate.

The structure shown in FIG. 58 diminishes the influence of angle of inclination exerted on accuracy as compared with the case of the structure shown in FIG. 56. Therefore, the structure shown in FIG. 58 enables an improvement in the accuracy of inclination of the imaging device after the device has been mounted on the substrate as compared with the case of the structure shown in FIG. 56.

As in the case of the seventeenth embodiment, the structure of the imaging device according to the present embodiment enables an improvement in photographing operability of a portable terminal equipment. In the present embodiment, during manufacture of lead frames, there is formed means in advance for determining a photographing direction of the imaging device after the device has been mounted on the substrate. Therefore, lead frames are protected from influence of time-varying changes in machining pattern ascribable to wearing of a die to be used for forming lead frames. Accordingly, the structure according to the present embodiment ensures a desired improvement in a stable manner over a longer period of time as compared with the case of the seventeenth embodiment.

Figure 59A:
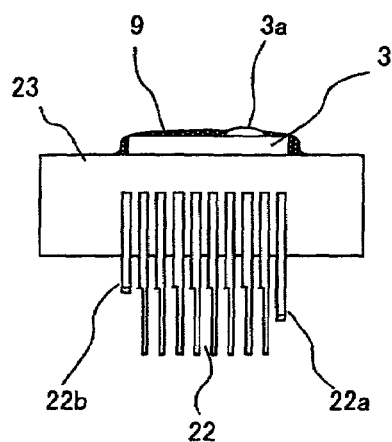
Figure 59B:
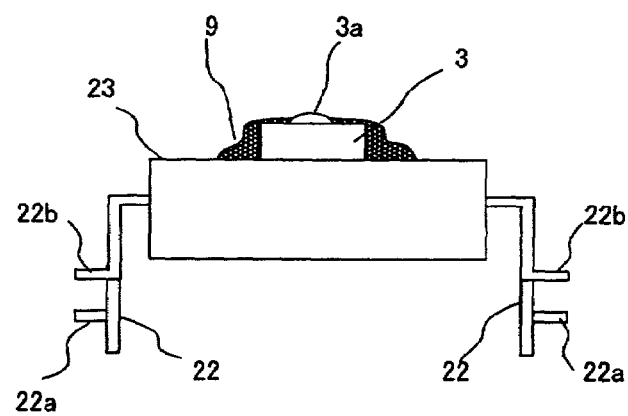

FIG. 59A shows a side view of another imaging device which yields the same advantages as those mentioned previously. FIG. 59B shows a front view of the device shown in FIG. 59A. In the imaging device shown in FIGS. 59A and 59B, only lead frames 22a and 22b provided on the respective ends of the row of lead frames are formed flat so that they can be subjected to surface mounting. The angle of inclination of the imaging device shown in FIGS. 59A and 59B after the device has been mounted on the substrate can be determined by means of the way to bend the lead frames 22a and 22b.

Figure 60:
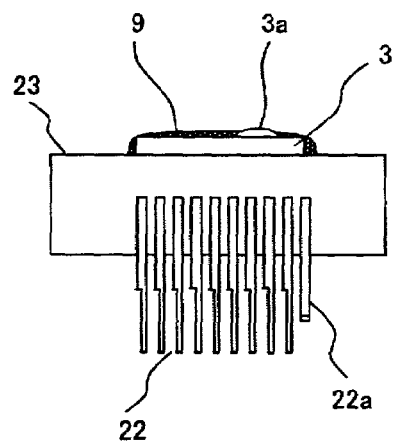

FIG. 60 is a side view showing still another imaging device which yields the same advantages as those mentioned previously. In the imaging device shown in FIG. 60, only a lead frame 22a provided on one end of the row of lead frames 22 is formed flat so that the lead frame can be subjected to surface mounting. In this imaging device, an imaginary line connecting between a step formed in the lead frame 22a and a step formed in a lead frame 22 located on the other end defines an angle of inclination of the imaging device after the device has been mounted on the substrate.

In FIGS. 56 through 60, those elements which are identical with elements shown in FIGS. 52A and 52B are assigned the same reference numerals, and repeated explanations thereof are omitted.

Nineteenth Embodiment

Figure 61A:
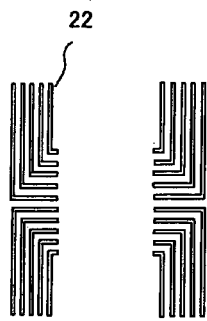
FIG. 61A is a plan view of a lead frame employed in an imaging device according to a nineteenth embodiment of the present invention.
Figure 61B:
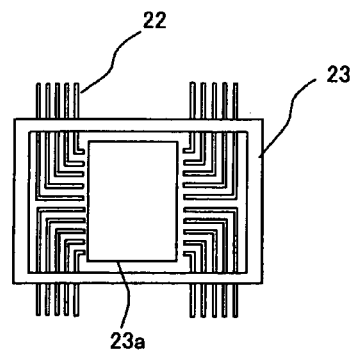
FIG. 61B is a plan view of a premolded package having the lead frame shown in FIG. 61A molded therein.

Next, a nineteenth embodiment of the present invention will be described by reference to FIGS. 61A through 63. FIG. 61A shows the structure of the lead frames before premolding, and FIG. 61B shows the status of a premolded package after premolding. In these drawings, reference numeral 23 designates a premolded material; and 23a designates an opening section formed in the premolded material 23. As shown in FIG. 61B, the imaging device according to the present embodiment is provided with a premolded material 23 which causes the lead frames 22 to extend in the direction perpendicular to the longitudinal direction thereof.

Figure 62A:
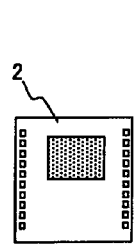
FIG. 62A is a plan view of an imaging element employed in the nineteenth embodiment.
Figure 62B:
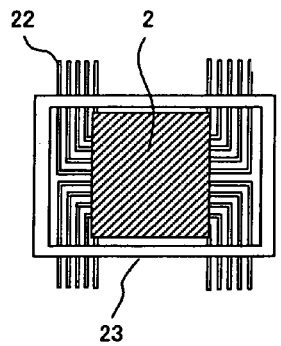
FIG. 62B is a plan view showing the imaging element shown in FIG. 62A when assembled within the premolded package shown in FIG. 61B.
Figure 62C:
FIG. 62C shows the structure shown in FIG. 62B when viewed from the side.
Figure 62D:
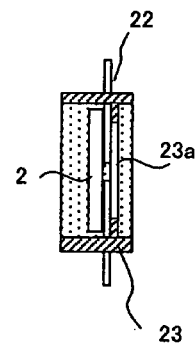
FIG. 62D is a perspective conceptual rendering of the structure when viewed from the side.

FIG. 62A is a plan view of the imaging element 2. FIG. 62B is a plan view showing the imaging element 2 when assembled face down within the premolded material 23. FIG. 62C shows the structure shown in FIG. 62B when viewed from the side. Further, FIG. 62D is a perspective conceptual rendering of the structure when viewed from the side.

In the present embodiment, the lead frame sections provided within the premolded package and I/O terminal sections provided on the imaging element 2 are arranged in a one-to-one relationship. Further, the opening section 23a formed in the premolded package is arranged so that the imaging element 2 can acquire optical information from the outside.

Figure 63A:
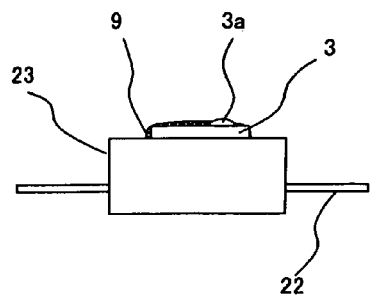
FIGS. 63A through 63C are views for describing an advantageous result yielded by the imaging device according to the nineteenth embodiment of the present invention.
Figure 63B:
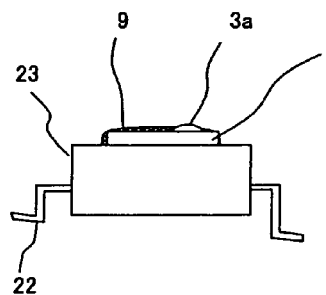
Figure 63C:
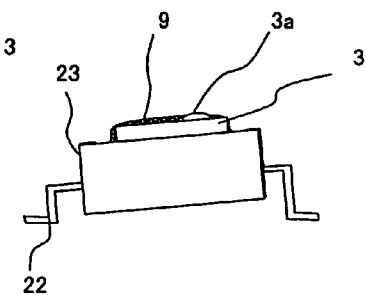

FIGS. 63A through 63C show the operation of the imaging device according to the present embodiment. In the premolded package of the imaging device according to the present embodiment, as shown in FIG. 63A, lead frames are provided in the vertical direction of the imaging element 2 (i.e., the horizontal direction in FIG. 63A). Here, the vertical direction of the imaging element 2 means the direction extending from the top to the bottom of the imaging element 2 in FIG. 62A. FIG. 63B shows the geometry of formed lead frames according to the present embodiment. As illustrated, in the present embodiment, the lead frames 22 extending upward of the imaging element 2 are formed to differ in shape from the lead frames 22 extending downward of the same. By means of forming the lead frames 22, the imaging device can be mounted on the substrate of the portable terminal equipment at a predetermined inclination.

According to the imaging device of the present embodiment, a desired angle of inclination can be defined between the imaging device and the substrate, thereby ensuring the same advantage as that yielded in the seventeenth embodiment, even in a case where restrictions are imposed on the location where the imaging device can be mounted because of limitations on layout, whereby the imaging device according to the seventeenth embodiment can not be mounted in a desired state. In FIGS. 62A to 63C, those elements which are identical with elements shown in FIGS. 61A and 61B are assigned the same reference numerals, and repeated explanations thereof are omitted.

Twentieth Embodiment

A twentieth embodiment of the present invention will now be described by reference to FIGS. 64 through 66B. In FIG. 64, reference numeral 2 designates an imaging element having a light-receiving surface 2a; 28 designates a substrate having a circuit pattern 28a formed on the side thereof; and 29 designates a socket component corresponding to the substrate 28. The socket component 29 characterizes the present embodiment and has such heat resistance as to be able to withstand the temperature at which the device is to be subjected while being soldered in a reflow furnace. Further, the socket component 29 has a circuit pattern 29a which enables electrical connection with the circuit pattern 28a when the substrate 28 constituting the imaging device is fitted into the socket component 29.

In the imaging device, a color filter is usually provided on the light-receiving surface 2a of the imaging element 2. Since the maximum temperature which the color filter can withstand is lower than the temperature of reflow heating used for solder mounting, the color filter cannot be mounted by means of a chip mounting apparatus at the time of assembly of other surface-mount components. Further, even when an optical-element-integral imaging device employs a plastic lens, there arises a similar problem; that is, difficulty in mounting through use of a chip mounter a lens which withstands a low temperature. In this case, there is usually employed a method of connecting an imaging device to a main substrate by way of a flexible printed circuit (FPC) or a connector.

In contrast, the structure according to the present embodiment enables desired electrical connection, by means of only the steps of mounting a heat-resistant socket component 29 to a main substrate through surface mounting and fitting the imaging device into the socket section 29 in a subsequent process after the socket component 29 has been subjected to soldering in a reflow furnace. Hence, the structure according to the present embodiment facilitates an operation required when an imaging device is mounted to the main substrate.

By means of the structure according to the present embodiment, removal of the imaging device is easy. Hence, even if replacement of parts becomes necessary for any reason, replacement can be effected readily, thereby improving work efficiency. The optical element and a mold section are not directly relevant to the characteristic of the present invention, and they are omitted. However, even when they are incorporated into the imaging device, there is yielded the same advantage as that described previously.

In the example shown in FIG. 64, the terminal section of the circuit pattern 29a of the socket component 29 is provided in the outer periphery of the socket component 29. However, the characteristic of the present invention does not lie in the geometry or location of the circuit pattern 29a of the socket component. More specifically, as shown in, e.g., FIG. 65C, the circuit terminals 29a may be provided on the bottom of the socket component 29.

Although FIGS. 64 and 65A to 65C illustrate the opening section 29b of the socket component 29 as a through hole, the present invention is not limited to this example. As shown in FIGS. 66A and 66B, the opening section 29b may have a cavity construction with a bottom surface. More specifically, the opening section 29b is for fitting the substrate 28 into the socket component 29. The opening section 29b may assume any shape, so long as the function is implemented.

Twenty-first Embodiment

A twenty-first embodiment of the present invention will now be described by reference to FIG. 67. An imaging device according to the present embodiment is embodied by means of providing the socket component 29 according to the twentieth embodiment with protuberances 29c to be used for positioning on a main substrate, and providing a main substrate 30 on which the socket component 29 is to be mounted with positioning recesses 30b which correspond to the protuberances 29c. As shown in FIG. 67, reference numeral 30 designates a main substrate; 30a designates a land section for establishing electrical connection with the socket component 29; and 30b designates a recess for positioning the socket component 29.

In the present embodiment, the protuberances 29c of the socket component 29 and the recesses 30b of the main substrate 30 are designed such that the circuit pattern 29a matches the land section 30a when the protuberances 29c are fitted into the recesses 30b. Further, at this time, a lens section of the imaging device to be incorporated into the socket component 29 is designed so as to match the opening section formed in a housing of a product into which the main substrate 30 is to be housed.

By means of providing the imaging device with two or more fitting sections, each consisting of the protuberance 29c and the recess 30b, the accuracy of the socket component 29 being provided on the main substrate 30 can be improved, particularly in the direction of θ shown in FIG. 67. The position of the imaging device to be fitted into the socket component 29 is determined by the fitting sections constituted of the protuberances 29c and the recesses 30b. Hence, so long as the accuracy of assembly of the socket component 29 is improved, the accuracy of assembly of an imaging device on the main substrate 30 can also be improved.

The symbol θ shown in FIG. 67 is of importance in a portable terminal equipment having a display section, such as a portable cellular phone. If angle θ of the imaging device and angle θ of the display device are out of alignment with a certain reference, a photographed image is displayed as being inclined at an angle corresponding to angle θ. However, the structure according to the present embodiment facilitates assembly of an imaging device without adjustment of angle θ, and there can be embodied a portable terminal equipment having superior imaging and display capacity.

Twenty-second Embodiment

Figure 68:
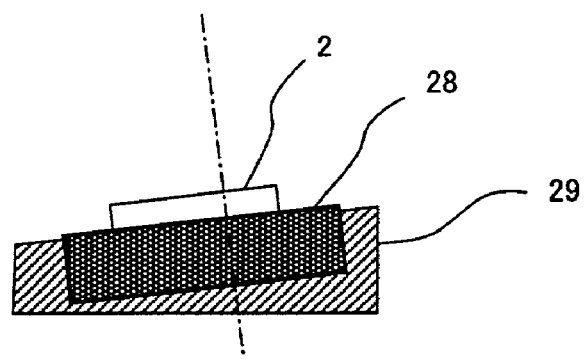
FIG. 68 is a cross-sectional view of an imaging device according to a twenty-second embodiment of the present invention.
Figures 69A, 69B, 69C:
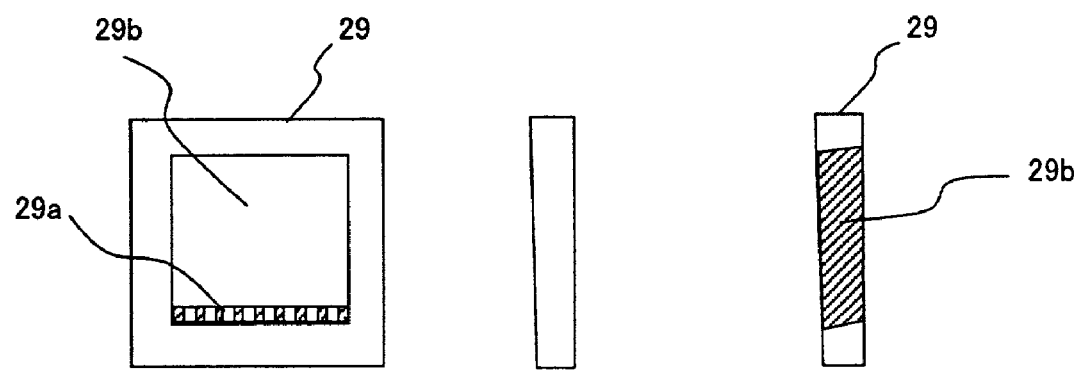
FIGS. 69A through 69C are views showing a socket component employed in the imaging device according to the twenty-second embodiment of the present invention.

A twenty-second embodiment of the present invention will now be described by reference to FIGS. 68 and 69A to 69C. FIG. 68 shows an imaging device according to the present embodiment when viewed from the side. FIGS. 69A and 69B show a front view and side view of the socket component 29. FIG. 69C is a perspective conceptual rendering of the socket component 29 when viewed from the side. The imaging device according to the present embodiment is embodied by means of tapering the interior surface of the socket component 29 according to the twentieth embodiment at a predetermined inclination. When the substrate 28 is fitted to the socket component 29, the photographing direction of the imaging element 2 can be imparted with a certain angle of inclination with respect to the bottom of the socket component 29.

The inclination of the socket component 29 relative to the bottom surface corresponds to an inclination relative to the main substrate 30 in FIG. 67. Hence, the structure according to the present embodiment yields the advantage of facilitating attachment of an imaging element to a main substrate, as well as the advantage of ability to improve the operability of a portable terminal equipment having an imaging device.

Since the present invention has been embodied in the manner as mentioned above, there are yielded the following advantages.

According to a first aspect of the present invention, the optical element having the imaging lens section is arranged so as to come into contact with the imaging element by way of the opening formed in the substrate. Hence, the present invention enables implementation of an imaging element of fixed focus type which obviates adjustment of a focal length.

According to a second aspect of the present invention, while electrical connection between the substrate and the imaging element is ensured outside the opening section, the optical element can be brought into contact with the imaging element within the opening section and without involvement of occurrence of interference between the light-receiving surface and imaging element.

According to a third aspect of the present invention, while the optical element remains in contact with the imaging element, the optical element can be bonded to the substrate. In this case, a stable focal length can be embodied without being affected by variations in the amount of adhesive to be applied.

According to a fourth aspect of the present invention, since the optical element is bonded to the substrate by means of a thermoplastic-resin-based adhesive, there can be generated force for pressing the optical element against the imaging element after setting of the adhesive, by means of utilization of volumetric constriction developing in the adhesive. Accordingly, the present invention realizes a superior accuracy of focal length without being affected by variations in the amount of adhesive to be applied.

According to a fifth aspect of the present invention, the contact area where the optical element is in contact with the imaging element surrounds the overall periphery of the light-receiving surface of the imaging element, thereby preventing entry of extraneous substances or moisture into to the light-receiving surface from the outside.

According to a sixth aspect of the present invention, a boundary section between the periphery of the imaging element and the substrate is sealed with the imaging element sealing resin, thereby preventing entry of extraneous substances or moisture into the device from a clearance in the boundary section. Further, according to the present invention, the imaging element sealing resin has a light-shielding function, and hence there is obviated a necessity of providing the imaging element with a special light-shielding cover, thus preventing entry of light into the light-receiving surface of the imaging element from the clearance.

According to a seventh aspect of the present invention, the optical element is integrally formed with the substrate while being covered with the optical element sealing resin, thereby preventing entry of extraneous substances or moisture into the device from a clearance between the optical element and the substrate. Further, according to the present invention, the optical element sealing resin can protect the optical element from external stress.

According to an eighth aspect of the present invention, the optical element sealing resin has a light-shielding function, thus preventing entry of light into the light-receiving surface of the imaging element from the clearance between the optical element and the substrate without a necessity of providing the imaging element with a special light-shielding cover.

According to a ninth aspect of the present invention, the imaging element is housed in a cavity which is formed by means of sealing the opening section of the substrate with the periphery element, thereby rendering the imaging device slimmer by the amount corresponding to the thickness of the cavity.

According to a tenth aspect of the present invention, a third element is stacked on the imaging element housed in the cavity or on the peripheral element constituting the cavity, thereby embodying a high-performance compact imaging device.

According to an eleventh aspect of the present invention, images located in different directions can be photographed by means of the imaging element and the second imaging element. Hence, the present invention can enhance the convenience of the imaging device.

According to a twelfth aspect of the present invention, the imaging element and the interface connection section can be electrically connected together, by way of a minute circuit pattern formed in an area (first section) at which an overlap exists between the substrate and the imaging element. The structure according to the present invention enables miniaturization of the substrate, which in turn embodies a compact imaging device.

According to a thirteenth aspect of the present invention, the optical element having the imaging lens section is arranged so as to come into contact with the imaging element by way of the opening section of the substrate. Hence, there can be readily embodied an imaging device of fixed focus type having a stable focal length.

According to a fourteenth aspect of the present invention, the optical element and the substrate are fixed together by means of an adhesive while the optical element remains in contact with the imaging element. Hence, the stable accuracy of focal length can be ensured.

According to a fifteenth aspect of the present invention, the contact area where the optical element is in contact with the imaging element surrounds the overall periphery of the light-receiving surface of the imaging element, thereby preventing entry of extraneous substances or moisture into to the light-receiving surface from the outside.

According to a sixteenth aspect of the present invention, the optical element sealing resin used for covering the optical element prevents entry of extraneous substances and moisture and can protect the optical element from external stress.

According to a seventeenth aspect of the present invention, a portion of the imaging element is uncovered, and hence the imaging element can be directly mounted to the main substrate by utilization of the uncovered portion.

According to an eighteenth aspect of the present invention, the adhesive used for fixing the uncovered portion of the imaging element and the main substrate is caused to act as a cushion, thereby protecting the imaging element from external stress.

According to a nineteenth aspect of the present invention, radio wave shielding material used for covering the imaging device can protect the imaging element from radio waves developing in a communications device. Therefore, the present invention embodies an imaging device which exhibits superior reliability while provided in a communications device.

According to a twentieth aspect of the present invention, the second sealing film having a moisture-prevention function and a damping function is provided inside the radio wave shielding material. Hence, the present invention embodies an imaging device having superior durability.

According to a twenty-first aspect of the present invention, since the radio wave shielding material has a light-shielding function, entry of undesired light into the light-receiving surface can be prevented without a necessity of providing the imaging device with a special light-shielding cover.

According to a twenty-second aspect of the present invention, the I/O terminals of the imaging element are provided in an area in a concentrated manner. Hence, the area (i.e., a protrusion) on the substrate to be used for establishing connection with the I/O terminals can be made small. The present invention enables acceleration of miniaturization of the imaging device.

According to a twenty-third aspect of the present invention, since the gate-shaped recess is formed in the optical element, the optical element can be brought into contact with the upper surface of the imaging element without involvement of occurrence of interference between the optical element and the protrusion on the substrate.

According to a twenty-fourth aspect of the present invention, the optical element and the substrate can be bonded together by means of utilization of the gate-shaped recess of the optical element. In this case, the adhesive strength of the adhesive acts as force for pressing the optical element against the imaging element, thereby ensuring the superior accuracy of focal length.

According to a twenty-fifth aspect of the present invention, the optical element having the imaging lens section is arranged so as to come into contact with the imaging element by way of the opening section of the premolded package, thereby achieving the superior accuracy of focal length.

According to a twenty-sixth aspect of the present invention, the optical element and the premolded package are bonded by means of an adhesive while the optical element remains in contact with the imaging element, thereby ensuring the stable accuracy of focal length.

According to a twenty-seventh aspect of the present invention, lead frames are formed such that the imaging element makes a predetermined angle of inclination relative to the main substrate. The present invention enables an imaging device which does not involve a necessity of a complicated rotation mechanism and improves the photographing operability of a portable terminal equipment without involvement of an increase in size or a decrease in rigidity.

According to a twenty-eighth aspect of the present invention, the imaging device can be imparted with a desired angle of inclination by means of making the base end sections of the lead frames different in shape or length from each other.

According to a twenty-ninth aspect of the present invention, there can be embodied an imaging device, by means of fitting the substrate having the imaging element mounted thereon into the socket section to be mounted on the main substrate. In this case, only the socket component is mounted beforehand on the main substrate by means of a chip mounter, and the substrate can be fitted to the socket section in a subsequent process, thereby facilitating an imaging device assembly process. The structure according to the present embodiment makes replacement of an imaging element more efficient.

According to a thirtieth aspect of the present invention, the socket section to be mounted on the main substrate is a heat-resistant component. Hence, the socket section can be mounted to the main substrate by utilization of a solder reflow process. In the present invention, the substrate can be attached to the socket in a subsequent process, and hence other components having low heat resistance can be mounted on the substrate along with the imaging element.

According to a thirty-first aspect of the present invention, there is provided the positioning mechanism. Hence, the socket component and the main substrate can be assembled with an appropriate positional relationship. The positional relationship between the socket component and the imaging element is determined substantially uniquely, by means of fitting the substrate into the socket component. Hence, the present invention enables appropriate determination of the positional relationship between the imaging element and the main substrate.

According to a thirty-second aspect of the present invention, since the positions of the socket component and main substrate are determined at two or more points, mutual rotation between the socket component and the main substrate can be prevented.

According to a thirty-third aspect of the present invention, the socket component is inclined such that the imaging element makes a predetermined angle of inclination relative to the main substrate. The present invention enables an imaging device which does not involve a necessity of a complicated rotation mechanism and improves the photographing operability of a portable terminal equipment without involvement of an increase in size or a decrease in rigidity.

Further, the present invention is not limited to these embodiments, but variations and modifications may be made without departing from the scope of the present invention.

What is claimed is:

1. An imaging device including integrally an imaging element to be mounted on a substrate and an optical element having an imaging lens section for providing a light-receiving surface of the imaging element with optical information, wherein
the substrate has an opening section;
the imaging element is fastened on the substrate so as to close the opening section with a surface including the light-receiving surface; and
the optical element is in direct contact with the upper surface of the imaging element by way of the opening section.

2. The imaging device according to claim 1, wherein connection means for establishing electrical connection between the substrate and the imaging element is provided in an overlap between the substrate and the imaging element; and the optical element is in contact with areas on the upper surface of the imaging element other than the light-receiving surface.

3. The imaging device according to claim 1, wherein the optical element remaining in contact with the upper surface of the imaging element by way of the opening section is bonded to the substrate by means of an adhesive.

4. The imaging device according to claim 3, wherein an adhesive used for bonding the optical element to the substrate is a thermoplastic-resin-based adhesive.

5. The imaging device according to claim 1, wherein a contact area where the optical element is in contact with the imaging element surrounds the overall periphery of the light-receiving surface.

6. The imaging device according to claim 1, further comprising imaging element sealing resin which is arranged so as to close a boundary between the periphery of the imaging element and the substrate and which exhibits an adhesive strength improvement function, a moisture-absorption prevention function, an extraneous material entry prevention function, and a light-shielding function.

7. The imaging device according to claim 1, further comprising optical element sealing resin which covers the optical element remaining in contact with the upper surface of the imaging element, thereby integrating the optical element with the substrate, and which has an extraneous material entry prevention function, a moisture-absorption prevention function, and a shock dampening function.

8. The imaging device according to claim 7, wherein the optical element sealing resin has a light-shielding function.

9. An imaging device comprising:
a substrate having an opening section;
an imaging element mounted on the substrate, the imaging element having a light receiving surface; and
an optical element having an imaging lens section,
wherein the imaging element is fastened on the substrate so as to close the opening section with a surface including the light-receiving surface, and
the optical element is mounted directly on an upper surface of the imaging element by way of the opening section.

10. The imaging device according to claim 9, wherein connection means for establishing electrical connection between the substrate and the imaging element is provided in an overlap between the substrate and the imaging element; and the optical element is in contact with areas on the upper surface of the imaging element other than the light-receiving surface.

11. The imaging device according to claim 9, wherein the optical element remaining in contact with the upper surface of the imaging element by way of the opening section is bonded to the substrate by means of an adhesive.

12. The imaging device according to claim 11, wherein an adhesive used for bonding the optical element to the substrate is a thermoplastic-resin-based adhesive.

13. The imaging device according to claim 9, wherein a contact area where the optical element is in contact with the imaging element surrounds the overall periphery of the light-receiving surface.

14. The imaging device according to claim 9, further comprising imaging element sealing resin which is arranged so as to close a boundary between the periphery of the imaging element and the substrate and which exhibits an adhesive strength improvement function, a moisture-absorption prevention function, an extraneous material entry prevention function, and a light-shielding function.

15. The imaging device according to claim 9, further comprising optical element sealing resin which covers the optical element remaining in contact with the upper surface of the imaging element, thereby integrating the optical element with the substrate, and which has an extraneous material entry prevention function, a moisture-absorption prevention function, and a shock dampening function.

16. The imaging device according to claim 15, wherein the optical element sealing resin has a light-shielding function.

* * * * *